(12) United States Patent
Tsuchiya et al.

(10) Patent No.: US 11,650,503 B2
(45) Date of Patent: May 16, 2023

(54) HARD MASK-FORMING COMPOSITION AND METHOD FOR MANUFACTURING ELECTRONIC COMPONENT

(71) Applicant: TOKYO OHKA KOGYO CO., LTD., Kawasaki (JP)

(72) Inventors: Junichi Tsuchiya, Kawasaki (JP); Keiichi Ibata, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 932 days.

(21) Appl. No.: 16/515,612

(22) Filed: Jul. 18, 2019

(65) Prior Publication Data
US 2020/0041904 A1 Feb. 6, 2020

(30) Foreign Application Priority Data

Aug. 2, 2018 (JP) .............................. JP2018-146032

(51) Int. Cl.
| | |
|---|---|
| *G03F 7/09* | (2006.01) |
| *C08G 8/24* | (2006.01) |
| *C08F 12/24* | (2006.01) |
| *C09D 165/00* | (2006.01) |
| *C09D 161/06* | (2006.01) |
| *C09D 125/08* | (2006.01) |
| *C09D 125/14* | (2006.01) |
| *H01L 21/033* | (2006.01) |
| *H01L 21/311* | (2006.01) |

(Continued)

(52) U.S. Cl.
CPC .............. *G03F 7/094* (2013.01); *C08F 12/24* (2013.01); *C08G 8/24* (2013.01); *C08G 61/124* (2013.01); *C09D 125/08* (2013.01); *C09D 125/14* (2013.01); *C09D 161/06* (2013.01); *C09D 165/00* (2013.01); *H01L 21/0337* (2013.01); *H01L 21/31144* (2013.01); *C08G 2261/124* (2013.01); *C08G 2261/148* (2013.01); *C08G 2261/1422* (2013.01); *C08G 2261/18* (2013.01); *C08G 2261/228* (2013.01); *C08G 2261/314* (2013.01); *C08G 2261/3241* (2013.01); *C08G 2261/3326* (2013.01); *G03F 7/162* (2013.01); *G03F 7/168* (2013.01)

(58) Field of Classification Search
CPC . G03F 7/11; G03F 7/094; G03F 7/168; C08G 61/08; C08G 2261/228; C08G 2261/3325; C08G 2261/418; C09D 165/00
See application file for complete search history.

(56) References Cited

U.S. PATENT DOCUMENTS

| | | |
|---|---|---|
| 2016/0342088 A1 | 11/2016 | Hatakeyama et al. |
| 2017/0017156 A1 | 1/2017 | Ogihara et al. |
| (Continued) | | |

FOREIGN PATENT DOCUMENTS

| | | | |
|---|---|---|---|
| JP | 61-239243 A | 10/1986 | |
| JP | 62-025744 A | 2/1987 | |
| JP | 2001-051422 A | 2/2001 | |
| (Continued) | | | |

*Primary Examiner* — Shane Fang
(74) *Attorney, Agent, or Firm* — Knobbe, Martens, Olson & Bear, LLP

(57) ABSTRACT

A hard mask-forming composition which forms a hard mask used in lithography, including: a resin containing an aromatic ring and a polar group; and a compound containing at least one of an oxazine ring fused to an aromatic ring, and a fluorene ring.

8 Claims, 4 Drawing Sheets

(51) Int. Cl.
    *C08G 61/12*     (2006.01)
    *G03F 7/16*     (2006.01)

(56)     References Cited

U.S. PATENT DOCUMENTS

| | | |
|---|---|---|
| 2017/0199457 A1 | 7/2017 | Hatakeyama et al. |
| 2019/0212650 A1* | 7/2019 | Takanashi ............... G03F 7/094 |

FOREIGN PATENT DOCUMENTS

| | | | |
|---|---|---|---|
| JP | 2010-524224 A | 7/2010 | |
| JP | 2010-271654 A | 12/2010 | |
| JP | 2015-091775 A | 5/2015 | |
| JP | 2017-021329 A | 1/2017 | |
| JP | 2017-102420 A | 6/2017 | |
| JP | 2017-125890 A | 7/2017 | |
| KR | 20080107208 * | 6/2007 | ............. G03F 7/004 |
| WO | WO 2008/120855 A1 | 10/2008 | |
| WO | WO 2018/052026 A1 | 3/2018 | |

* cited by examiner

HARD MASK-FORMING COMPOSITION AND METHOD FOR MANUFACTURING ELECTRONIC COMPONENT

BACKGROUND OF THE INVENTION

Field of the Invention

The present invention relates to a hard mask-forming composition and a method for manufacturing an electronic component.

Priority is claimed on Japanese Patent Application No. 2018-146032, filed on Aug. 2, 2018, the content of which is incorporated herein by reference.

Description of Related Art

Generally, in semiconductor manufacturing, a laminate in which a resist film is formed on a substrate, such as a silicon wafer, is subjected to processing including dry etching, for example, a treatment in which dry etching is carried out with the resist film which is selectively exposed to form a resist pattern thereon as a mask, thereby forming a pattern on the substrate.

As a pattern-forming method using a resist film, a three-layer resist method is known (for example, see Japanese Unexamined Patent Application First Publication No. 2001-051422). The three-layer resist method involves an organic hard mask layer being formed using an organic material on a support, an inorganic hard mask layer being formed using an inorganic material on the organic hard mask layer; a resist film being further formed on the inorganic hard mask layer; a resist pattern being formed by typical lithography; an inorganic hard mask pattern being formed by etching the inorganic hard mask layer with the resist pattern as a mask; an organic hard mask pattern being formed by etching the organic hard mask layer with the inorganic hard mask pattern as a mask; and the support being processed by being etched with the organic hard mask pattern as a mask.

Additionally, a two-layer resist method with fewer steps than the three-layer resist method has also been proposed (for example, see Japanese Unexamined Patent Application First Publication Nos. S61-239243 and S62-025744). The two-layer resist method involves the organic hard mask layer being provided on the support in the same manner as in the three-layer resist method; the resist film being provided on the organic hard mask layer; the resist pattern being formed by typical lithography; the organic hard mask pattern being formed by etching the organic hard mask layer with the resist pattern as a mask; and the support being processed by being etched with the organic hard mask pattern as a mask.

As a method of forming the organic hard mask layer, a chemical vapor deposition method (hereinafter, sometimes referred to as a "CVD method)" is generally known. The CVD method uses amorphous carbon as a hard mask-forming material and has problems including slow throughput and expensive equipment investment.

Therefore, film formation by spin-on-coating has been introduced in recent years (for example, see Japanese Unexamined Patent Application First Publication No. 2015-091775), for which organic hard mask-forming materials applicable to such a film formation have been proposed. The spin-on-coating has advantageous effects of high throughput and usability of the existing spin coater as compared with the CVD method.

SUMMARY OF THE INVENTION

An organic hard mask-forming material is required to have high etching resistance in order to serve as a mask for substrate processing. However, the organic hard mask layer formed by spin-on-coating generally has lower etching resistance as compared with an amorphous carbon layer formed by a CVD method, which may cause defects during pattern transfer. Consequently, the development of an organic hard mask-forming material applicable to spin-on coating and having high etching resistance is required.

On the other hand, a substrate is generally processed several times in a manufacturing process of a semiconductor device. The processed substrate includes various steps, thus a material having excellent embeddability and flattening property is required for an organic hard mask material in the case where further processing is needed. If the organic hard mask material has insufficient embeddability, cavities (voids) may be formed between an organic hard mask layer and the substrate, thus mask performance of the organic hard mask layer may be deteriorated.

The present invention is made to provide a hard mask-forming composition having high etching resistance, which is also excellent in embeddability, and a method for manufacturing an electronic component using the hard mask-forming composition with consideration of such problems.

The present invention adopts the following composition in order to solve the problems.

That is, a first aspect of the present invention provides a hard mask-forming composition, which forms a hard mask used in lithography, including: a resin (P) containing an aromatic ring and a polar group; and a compound (OF) containing at least one structure selected from the group consisting of an oxazine ring fused to an aromatic ring, and a fluorene ring.

A second aspect of the present invention provides a method for manufacturing an electronic component, including: forming a hard mask layer (m1) on a support using the hard mask-forming composition according to the first aspect; forming a hard mask layer (m2) made of an inorganic material on the hard mask layer (m1); forming a resist film on the hard mask layer (m2); forming a resist pattern on the hard mask layer (m2) by exposing and developing the resist film; etching the hard mask layer (m2) using the resist pattern as a mask to form an inorganic pattern; etching the hard mask layer (m1) using the inorganic pattern as a mask to form a resin pattern; and processing the support with the resin pattern as a mask.

A third aspect of the present invention provides a method for manufacturing an electronic component, including: forming a hard mask layer (m1) on a support using the hard mask-forming composition according to the first aspect; forming an inorganic pattern made of an inorganic material on the hard mask layer (m1); etching the hard mask layer (m1) using the inorganic pattern as a mask to form a resin pattern; and processing the support with the resin pattern as a mask.

According to the present invention, it is possible to provide a hard mask-forming composition having high etching resistance, which is also excellent in embeddability, and a method for manufacturing an electronic component using the hard mask-forming composition.

DETAILED DESCRIPTION OF THE INVENTION

Figure 1:
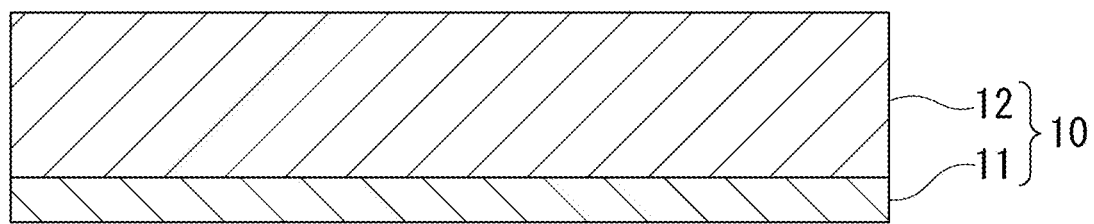
FIG. 1 is a cross-sectional view showing an exemplified support used in a method for manufacturing an electronic component according to an embodiment of the present invention.

In the detailed description and claims of the present invention, the term "aliphatic" is a relative concept to "aromatic", and is defined to mean a group, a compound or the like, which has no aromaticity.

The term "alkyl group" is intended to encompass linear, branched and cyclic monovalent saturated hydrocarbon groups, unless otherwise specified. The same definition applies to an alkyl group in an alkoxy group.

The term "alkylene group" is intended to encompass linear, branched and cyclic divalent saturated hydrocarbon groups, unless otherwise specified.

The term "halogenated alkyl group" refers to a group in which part or all of the hydrogen atoms of the alkyl group are substituted with halogen atoms, and examples of the halogen atom include a fluorine atom, a chlorine atom, a bromine atom and an iodine atom.

The term "fluorinated alkyl group" or "fluorinated alkylene group" refers to a group in which a part or all of hydrogen atoms of an alkyl group or an alkylene group are substituted with fluorine atoms.

The term "structural unit" refers to a monomer unit (monomer unit) constituting a polymer compound (resin, polymer or copolymer).

The expression "may have a substituent" includes both cases where a hydrogen atom (—H) is substituted by a monovalent group, and where a methylene group (—CH$_2$—) is substituted by a divalent group.

The term "exposure (exposing)" is a concept that includes general radiation irradiations.

In the detailed description and claims of the present invention, some structures represented by a chemical formula have an asymmetric carbon, and there may be enantiomers and diastereomers. Those isomers are collectively represented by one formula. The isomers may be used alone or in combination.

<Hard Mask-Forming Composition>

The hard mask-forming composition according to the first aspect of the present invention is a composition for forming a hard mask used in lithography. The hard mask-forming composition of the embodiment includes a resin (P) containing an aromatic ring and a polar group (hereinafter referred to as "resin (P)"), and a compound (OF) containing at least one structure selected from the group consisting of an oxazine ring fused to an aromatic ring, and a fluorene ring.

(Resin (P))

The resin (P) is a resin containing an aromatic ring and a polar group.

The aromatic ring contained in resin (P) is not particularly limited as long as it is a cyclic conjugated system having 4n+2π electrons, and may be monocyclic or polycyclic. The aromatic ring preferably has 5 to 30 carbon atoms, more preferably 5 to 20 carbon atoms, still more preferably 6 to 16 carbon atoms.

Specific examples of the aromatic ring include an aromatic hydrocarbon ring such as benzene, naphthalene, anthracene, phenanthrene or the like; an aromatic heterocyclic ring in which a party of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyridine ring, a thiophene ring and the like.

The aromatic ring contained in the resin (P) may be one, or may be two or more.

In the case where the resin (P) has plural types of the structural units, at least one type of the structural unit contains the aromatic ring.

The polar group contained in the resin (P) is not particularly limited, but examples of the polar group include a hydroxyl group, a carboxy group, an amino group, a sulfo group, an alkoxy group, an epoxy group and the like. The alkoxy group preferably has 1 to 5 carbon atoms, more preferably 1 to 3 carbon atoms. Among these, as the polar group, the hydroxyl group or the carboxyl group is preferred, and the hydroxyl group is more preferred.

The polar group contained in the resin (P) may be one, or may be two or more.

In the case where the resin (P) has plural types of the structural units, at least one type of the structural unit contains the polar group.

In the resin (P), it is preferred that the polar group exists as a substituent for substituting a hydrogen atom in the aromatic ring stated above. In other words, the resin (P) is preferably a resin having a structural unit including an aromatic ring in which one or more hydrogen atoms are substituted with a substituent with a polar group.

The resin (P) is preferably soluble at a concentration of 30 mass % or more at 25° C. (room temperature) when dissolved in propylene glycol monomethyl ether acetate (PGMEA). PGMEA is an organic solvent generally used as a solvent for a hard mask-forming composition. Since the resin (P) is soluble in PGMEA at a concentration of 30 mass % or more, the resin P is also capable of thickening an organic hard mask layer (for example, to have a film thickness of 2.0 μm or more). From such a viewpoint, it is preferred that the resin (P) is free of a bisnaphthol skeleton (a structure in which two naphthols are linked by a single bond or a divalent linking group). In particular, it is preferred that the resin (P) is free of a structure represented by the following general formula (1).

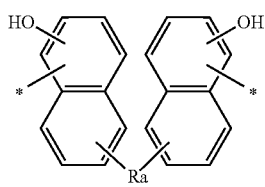

(1)

In the formula, Ra represents a single bond or a divalent linking group, and the mark "*" represents a bond.

In the general formula (1), Ra represents a single bond or a divalent linking group.

The divalent linking group in Ra is not particularly limited, and may be any linking group.

Preferred examples of the resin (P) include a resin (P-1), a resin (P-2) and a resin (P-3), which will be described below.

[Resin (P-1)]

Preferred examples of the resin (P) include a resin having a structural unit (u11) represented by the following general formula (u11-1) and a structural unit (u12) represented by the following general formula (u12-1) (hereinafter referred to as "resin (P-1)").

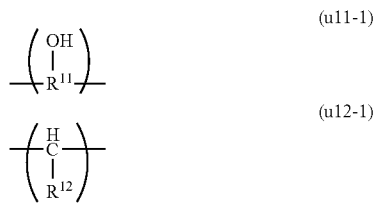

(u11-1)

(u12-1)

In the formulae, $R^{11}$ is a polycyclic aromatic hydrocarbon group having 10 to 30 carbon atoms which may have a substituent, and $R^{12}$ is an aromatic hydrocarbon group having 6 to 30 carbon atoms which may have a substituent, or a hydrogen atom.

[Structural Unit (u11)]

The structural unit (u11) is a structural unit represented by the general formula (u11-1). In the general formula (u11-1), $R^{11}$ is a polycyclic aromatic hydrocarbon group having 10 to 30 carbon atoms which may have a substituent. The polycyclic aromatic hydrocarbon group preferably has 12 to 25 carbon atoms, more preferably 12 to 20 carbon atoms. The carbon atoms contained in the substituent are not counted. Hereinafter, the carbon atoms contained in the substituent are not counted, unless otherwise specified.

The polycyclic aromatic hydrocarbon group in $R^{11}$ is a hydrocarbon group having at least two aromatic rings. The aromatic ring is not particularly limited as long as it is a cyclic conjugated system having $4n+2\pi$ electrons. The aromatic ring preferably has 5 to 20 carbon atoms, more preferably 5 to 18 carbon atoms, still more preferably 6 to 16 carbon atoms.

Specific examples of the aromatic ring include an aromatic hydrocarbon ring such as benzene, naphthalene, anthracene, phenanthrene, pyrene, perylene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring, an indole ring, a benzimidazole ring, a quinoline ring, a benzothiophene ring and the like.

Specific examples of the polycyclic aromatic hydrocarbon group for $R^{11}$ include a group (an arylene group or a heteroarylene group) obtained by removing three hydrogen atoms from a fused ring of an aromatic hydrocarbon ring or a fused ring of an aromatic heterocyclic ring; a group obtained by removing three hydrogen atoms from an aromatic compound (for example biphenyl, fluorene, perylene and the like) containing two or more aromatic rings; and the like.

The polycyclic aromatic hydrocarbon group for $R^{11}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms. Preferred examples of the substituent include a linear or branched alkyl group having 1 to 3 carbon atoms. The polycyclic aromatic hydrocarbon group for is preferably a group having no substituent from the viewpoint of improving etching resistance.

The polycyclic aromatic hydrocarbon group for is preferably a group obtained by removing three hydrogen atoms from a fused ring of the aromatic hydrocarbon ring, or a group obtained by removing three hydrogen atoms from the aromatic compound containing two or more aromatic rings; more preferably a group obtained by removing three hydrogen atoms from naphthalene, anthracene, phenanthrene, pyrene, or perylene.

Specific examples of $R^{11}$ are shown below. In the following formulae, the mark "*" represents a bond to be bonded to an oxygen atom.

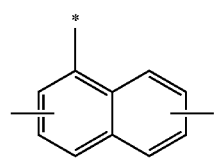

(R11-1)

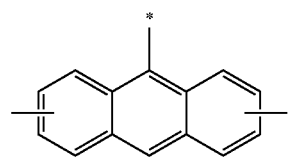

(R11-2)

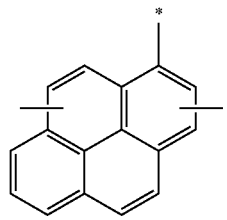

(R11-3)

(R11-4)

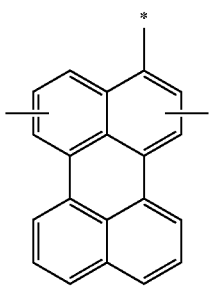

Specific examples of the structural unit (u11) are shown below.

(u11-1-1)

(u11-1-2)

(u11-1-3)

(u11-1-4)

The structural unit (u11) of the resin (P-1) may be one, or may be two or more.

A proportion of the structural unit (u11) in the resin (P-1) is preferably 1 to 60 mol %, more preferably 3 to 50 mol %, based on the total sum of all structural units constituting the resin (P-1).

In the case where the proportion of the structural unit (u11) is at least the lower limit value of the preferable range stated above, etching resistance and heat resistance are improved. Additionally, in the case where the proportion of the structural unit (u11) is equal to or less than the upper limit value of the preferable range state above, the structural unit (u11) can be easily balanced with other structural units.

[Structural Unit (u12)]

The structural unit (u12) is a structural unit represented by the general formula (u12-1). In the general formula (u12-1), $R^{12}$ is an aromatic hydrocarbon group having 6 to 30 carbon atoms which may have a substituent, or a hydrogen atom. The aromatic hydrocarbon group preferably has 6 to 25 carbon atoms.

The aromatic hydrocarbon group for $R^{12}$ is a hydrocarbon group having at least one aromatic ring. The aromatic ring is not particularly limited as long as it is a cyclic conjugated system having $4n+2\pi$ electrons, and may be monocyclic or polycyclic. The aromatic ring preferably has 5 to 20 carbon atoms, more preferably 5 to 18 carbon atoms, still more preferably 6 to 16 carbon atoms.

Specific examples of the aromatic ring include an aromatic hydrocarbon ring such as benzene, naphthalene, anthracene, phenanthrene, pyrene, or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring and the like.

Specific examples of the aromatic hydrocarbon group for $R^{12}$ include a group (an aryl group or a heteroaryl group) obtained by removing one hydrogen atom from the aromatic hydrocarbon ring or the aromatic heterocyclic ring; a group obtained by removing one hydrogen atom from an aromatic compound (for example, biphenyl, fluorene, and the like) containing two or more aromatic rings; a group (for example, an arylalkyl group such as a benzyl group, a phenethyl group, an 1-naphthylmethyl group, a 2-naphthylmethyl group, an 1-naphthylethyl group, a 2-naphthylethyl group or the like) in which one of the hydrogen atoms of the aromatic hydrocarbon ring or the aromatic heterocyclic ring is substituted with an alkylene group; and the like. An alkylene group to be bonded to the aromatic hydrocarbon ring or the aromatic heterocyclic ring preferably has 1 to 4 carbon atoms, more preferably 1 to 2 carbon atoms, particularly preferably 1 carbon atom.

The aromatic hydrocarbon group for $R^{12}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms. Preferred examples of the substituent include a linear or branched alkyl group having 1 to 3 carbon atoms. The aromatic hydrocarbon group for $R^{12}$ is preferably a group having no substituent from the viewpoint of improving etching resistance.

Specific examples of the aromatic hydrocarbon group for $R^{12}$ are shown below. In the following formulae, the mark "*" represents a bond to be bonded to a carbon atom.

(R12-1)

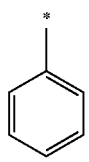

(R12-2)

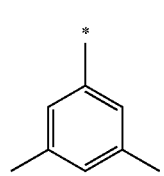

-continued
(R12-3)
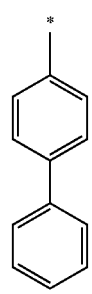
(R12-4)
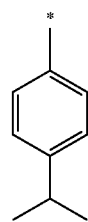
(R12-5)
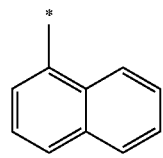
(R12-6)
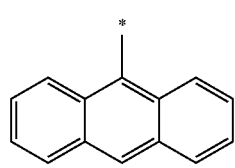
(R12-7)
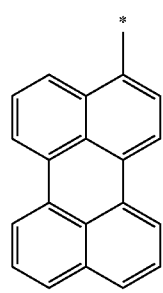
(R12-8)
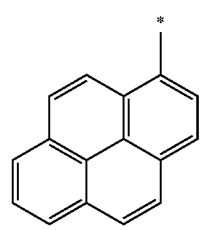
Specific examples of the structural unit (u12) are shown below.
(u12-1-1)
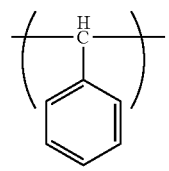
(u12-1-2)
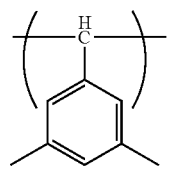
(u12-1-3)
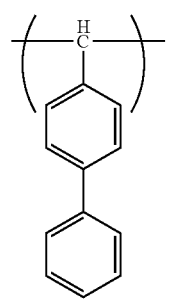
(u12-1-4)
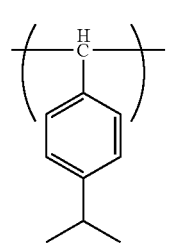
(u12-1-5)
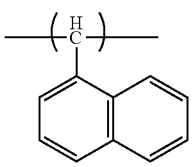
(u12-1-6)
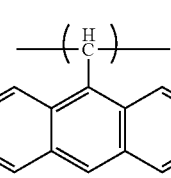
(u1-12-7)
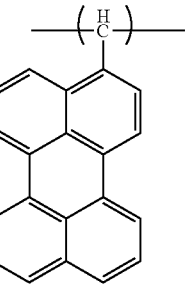

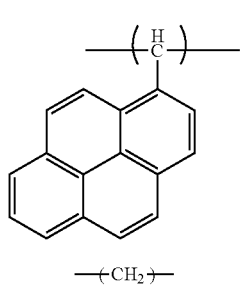

(u12-1-8)

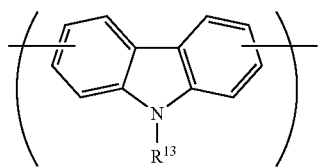

(u12-1-9)

The structural unit (u12) of the resin (P-1) may be one, or may be two or more.

A proportion of the structural unit (u12) in the resin (P-1) is preferably 30 to 70 mol %, more preferably 40 to 60 mol %, still more preferably 50 mol %, based on the total sum of all structural units constituting the resin (P-1).

In the case where the proportion of the structural unit (u12) is at least the lower limit value of the preferable range stated above, etching resistance and heat resistance are improved. Additionally, in the case where the proportion of the structural unit (u12) is equal to or less than the upper limit value of the preferable range state above, the structural unit (u12) can be easily balanced with other structural units.

[Other Structural Units]

The resin (P-1) may contain the other structural units in addition to the structural units (u11) and (u12) stated above. Examples of the other structural unit include a structural unit (u13) represented by the following general formula (u13-1).

(u13-1)

In the formula, $R^{13}$ is a hydrocarbon group having 1 to 20 carbon atoms which may have a substituent, or a hydrogen atom.

[Structural Unit (u13)]

It is preferable that the resin (P-1) have a structural unit (u13) represented by the following general formula (u13-1). The structural unit (u13) is effective to improve etching resistance of the resin (P-1).

In the general formula (u13-1), $R^{13}$ is a hydrocarbon group having 1 to 20 carbon atoms which may have a substituent, or a hydrogen atom. The hydrocarbon group for $R^{13}$ may be an aliphatic hydrocarbon group or an aromatic hydrocarbon group.

The aliphatic hydrocarbon group for $R^{13}$ may be a saturated aliphatic hydrocarbon group or an unsaturated aliphatic hydrocarbon group. In particular, examples of the aliphatic hydrocarbon group include a linear or branched aliphatic hydrocarbon group, an aliphatic hydrocarbon group containing a ring in a structure, and the like.

The linear aliphatic hydrocarbon group preferably has 1 to 10 carbon atoms, more preferably 1 to 5 carbon atoms, still more preferably 1 to 3 carbon atoms. The branched aliphatic hydrocarbon group preferably has 3 to 10 carbon atoms, more preferably 3 to 5 carbon atoms.

Specific examples of the linear or branched aliphatic hydrocarbon group include a linear alkyl group such as a methyl group, an ethyl group, an n-propyl group, an n-butyl group, an n-pentyl group or the like; a branched alkyl group such as an isopropyl group, an isobutyl group, a tert-butyl group, an isopentyl group, a neopentyl group, an 1,1-diethylpropyl group, a 2,2-dimethylbutyl group or the like; a linear alkenyl group such as a vinyl group, a propenyl group (allyl group), a 2-butenyl group or the like; a branched alkenyl group such as an 1-methylvinyl group, a 2-methylvinyl group, an 1-methylpropenyl group, a 2-methylpropenyl group or the like; a linear alkynyl group such as an ethynyl group, a propargyl group, a 3-pentynyl group or the like; a branched alkynyl such as an 1-methylpropargyl group or the like; and the like.

The linear or branched aliphatic hydrocarbon group for $R^{13}$ may or may not have a substituent. Examples of the substituent include a hydroxy group, a carbonyl group, an alkoxy group, a halogen atom and the like.

Examples of the aliphatic hydrocarbon group containing a ring in the structure for $R^{13}$ include an alicyclic hydrocarbon group (a group obtained by removing one hydrogen atom from an aliphatic hydrocarbon ring), a group in which one of hydrogen atoms of the aliphatic hydrocarbon ring is substituted by an alkylene group, and the like. The alkylene group preferably has 1 to 4 carbon atoms. The aliphatic hydrocarbon ring preferably has 3 to 10 carbon atoms, more preferably 3 to 6 carbon atoms.

The aliphatic hydrocarbon ring may be polycyclic or monocyclic.

The monocyclic aliphatic hydrocarbon ring is preferably a ring having 3 to 6 carbon atoms. Specific examples thereof include cyclopropane, cyclobutane, cyclopentane, cyclohexane and the like.

The polycyclic aliphatic hydrocarbon ring is preferably a ring having 7 to 10 carbon atoms. Specific examples thereof include polycycloalkanes having a bridged ring system polycyclic skeleton, such as adamantane, norbornane, isobornane or the like.

The cyclic aliphatic hydrocarbon group for $R^{13}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms.

Further, the substituent may be a substituent with which a part of carbon atoms constituting an alicyclic structure is substituted. Examples of the substituent include —O—, —C(=O)—O—, —S—, —S(=O)$_2$—, —S(=O)$_2$—O—, —N—, and the like.

In the case where the hydrocarbon group for $R^{13}$ is an aromatic hydrocarbon group, the aromatic hydrocarbon group is a hydrocarbon group having at least one aromatic ring. The aromatic ring is not particularly limited as long as it is a cyclic conjugated system having 4n+2π electrons, and may be monocyclic or polycyclic. The aromatic ring preferably has 5 to 20 carbon atoms, more preferably 5 to 18 carbon atoms, still more preferably 6 to 16 carbon atoms.

Specific examples of the aromatic ring include an aromatic hydrocarbon ring such as benzene, naphthalene, anthracene, phenanthrene, pyrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring and the like.

Specific examples of the aromatic hydrocarbon group for $R^{13}$ include a group (an aryl group or a heteroaryl group) obtained by removing one hydrogen atom from the aromatic hydrocarbon ring or the aromatic heterocyclic ring; a group obtained by removing one hydrogen atom from an aromatic compound (for example, biphenyl, fluorene, and the like) containing two or more aromatic rings; a group (for example, an arylalkyl group such as a benzyl group, a phenethyl group, an 1-naphthylmethyl group, a 2-naphthylmethyl group, an 1-naphthylethyl group, a 2-naphthylethyl group and the like) in which one of hydrogen atoms of the aromatic hydrocarbon ring or the aromatic heterocyclic ring is substituted with an alkylene group; and the like. An alkylene group to be bonded to the aromatic hydrocarbon ring or the aromatic heterocyclic ring preferably has 1 to 4 carbon atoms, more preferably 1 to 2 carbon atoms, particularly preferably 1 carbon atom.

The aromatic hydrocarbon group for $R^{13}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms.

Among them, the aromatic hydrocarbon group is preferable, and a polycyclic aromatic hydrocarbon group is more preferred as the hydrocarbon group for $R^{13}$, since the carbon amount of the resin can be increased and etching resistance will be improved. Those having no substituent are more preferred.

Specific examples of $R^{13}$ are shown below. In the following formulae, the mark "*" represents a bond to be bonded to a nitrogen atom.

(R13-1)

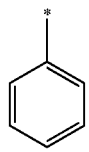

(R13-2)

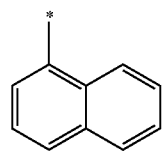

(R13-3)

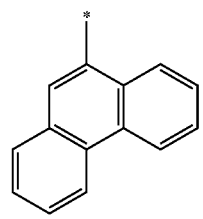

(R13-4)

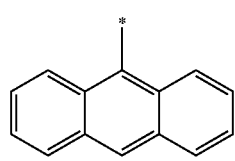

-continued (R13-5)

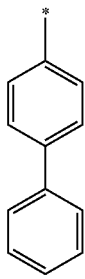

(R13-6)

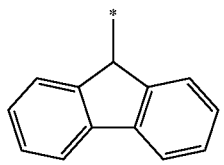

(R13-7)

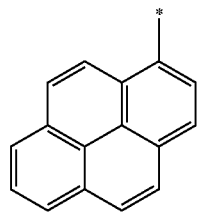

(R13-8)

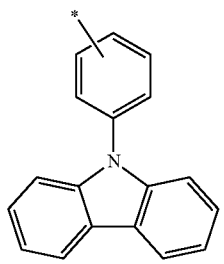

Specific examples of the structural unit (u13) are shown below.

(u13-1-1)

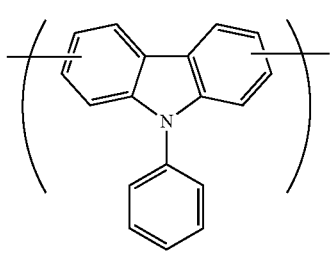

(u13-1-2)

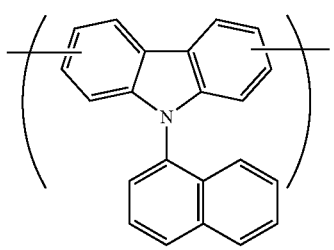

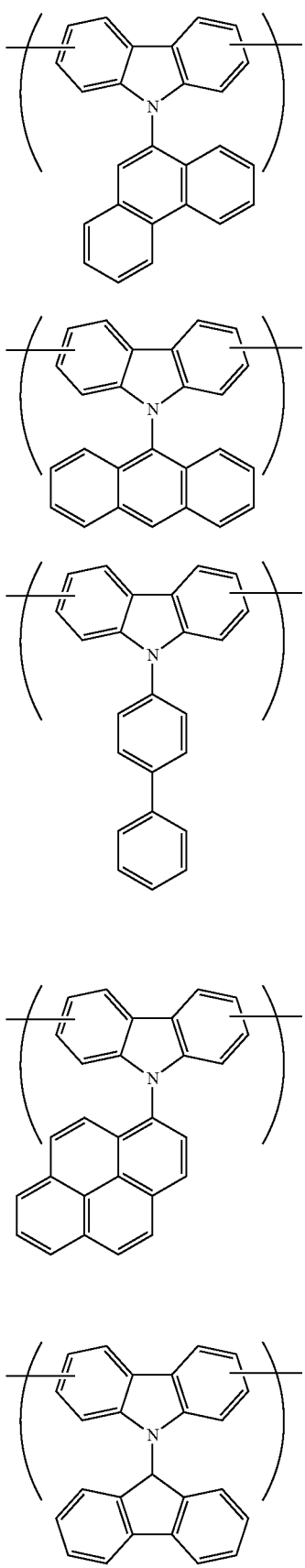

(u13-1-3)
(u13-1-4)
(u13-1-5)
(u13-1-6)
(u13-1-7)

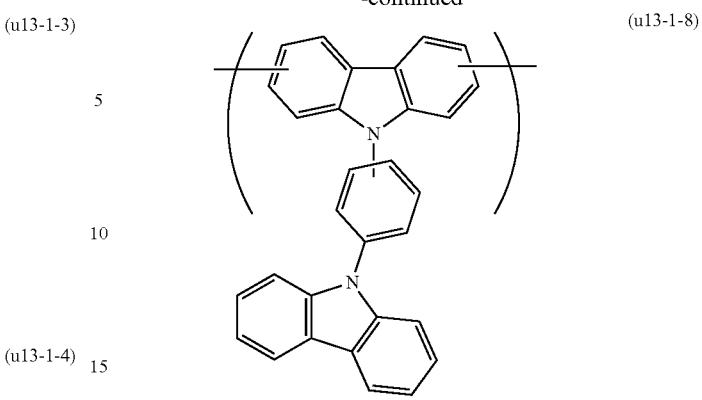

(u13-1-8)

The structural unit (u13) of the resin (P-1) may be one, or may be two or more.

In the case where the resin (P-1) has the structural unit (u13), a proportion of the structural unit (u13) in the resin (P-1) is preferably 1 to 60 mol %, more preferably 3 to 50 mol %, based on the total sum of all structural units constituting the resin (P-1).

In the case where the proportion of the structural unit (u13) is at least the lower limit value of the preferable range stated above, etching resistance and heat resistance are improved. Additionally, in the case where the proportion of the structural unit (u13) is equal to or less than the upper limit value of the preferable range state above, the structural unit (u13) can be easily balanced with other structural units.

The resin (P-1) may contain a structural unit other than the structural unit (u13) as the other structural units. A structural unit with a high carbon amount is preferred as such a structural unit from the viewpoint of etching resistance. For example, a structural unit (except for those corresponding to any one of the structural units (u11) to (u13)) containing an aromatic hydrocarbon group is exemplified.

Examples of the resin (P-1) include a resin having the structural unit (u11) and the structural unit (u12); a resin having the structural unit (u11), the structural unit (u12) and the structural unit (u13); and the like.

Examples of such a resin include a copolymer of a monomer from which the structural unit (u11) is derived and a monomer from which the structural unit (u12) is derived; a copolymer of a monomer from which the structural unit (u11) is derived, a monomer from which the structural unit (u12) is derived, and a monomer from which the structural unit (u13) is derived; and the like.

A mass average molecular weight (Mw) (based on polystyrene conversion by gel permeation chromatography (GPC)) of the resin (P-1) is not particularly limited, and is preferably about 1,000 to 500,000, more preferably about 3,000 to 50,000. Excellent etching resistance and heat resistance are obtained as Mw of the resin (P-1) falls within the preferable range stated above.

A dispersion degree (Mw/Mn) of the resin (P-1) is not particularly limited, and is preferably about 1.0 to 4.0, more preferably about 1.0 to 3.0, particularly preferably about 1.0 to 2.5. Mn represents a number average molecular weight.

The resin (P-1) may be used alone or in combination.

The resin (P-1) can be prepared by, for example, condensing the monomer from which the structural unit (u11) is derived and the monomer from which the structural unit (u12) is derived, and optionally a monomer from which the other structural unit (for example, the structural unit (u13)), in the presence of an acid catalyst. A phenol compound can be typically used as the monomer from which the structural unit (u11) is derived. An aldehyde compound can be typically used as the monomer from which the structural unit (u12) is derived. The acid catalyst is not particularly limited, and examples thereof include hydrochloric acid, nitric acid, sulfuric acid, formic acid, oxalic acid, acetic acid and the like.

Specific examples of the resin (P-1) are shown below.

(P-1-1)
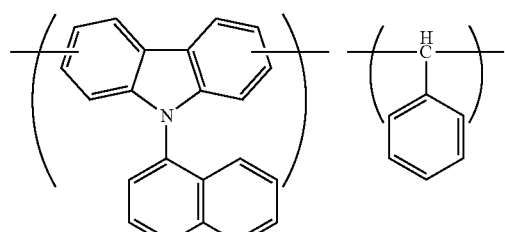

(P-1-2)
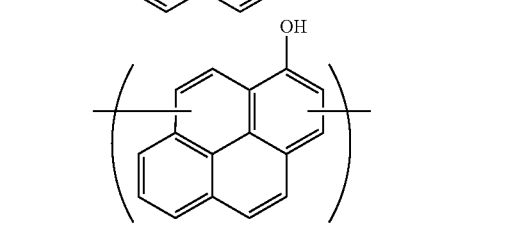

(P-1-3)
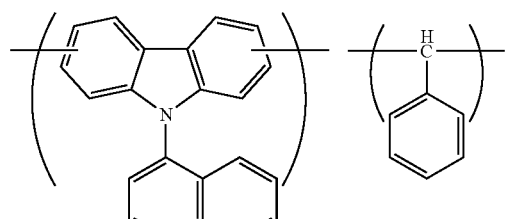

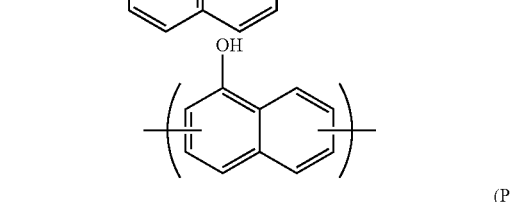

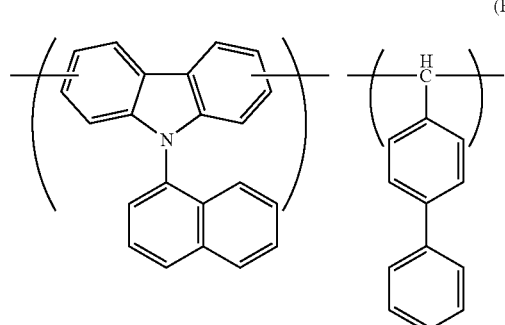

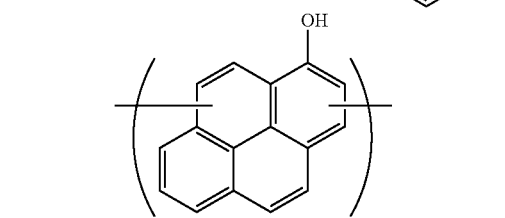

-continued (P-1-4)
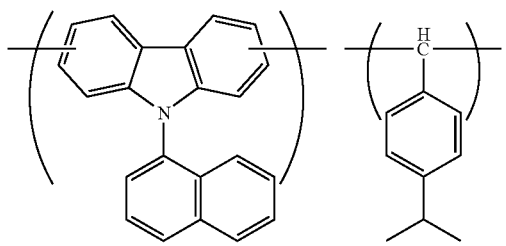

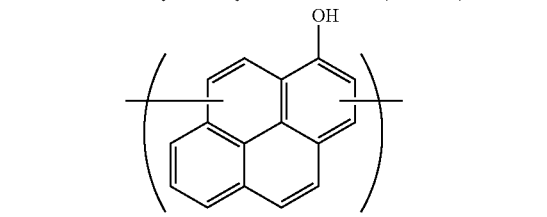

(P-1-5)
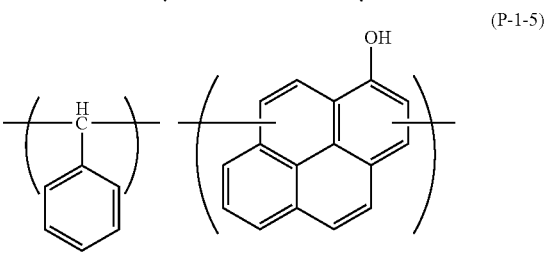

(P-1-6)
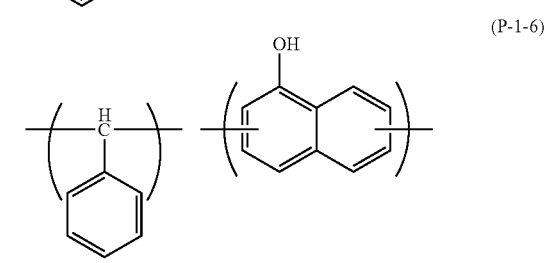

(P-1-7)
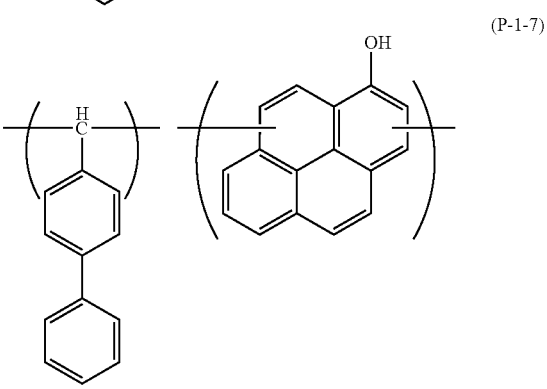

(P-1-8)
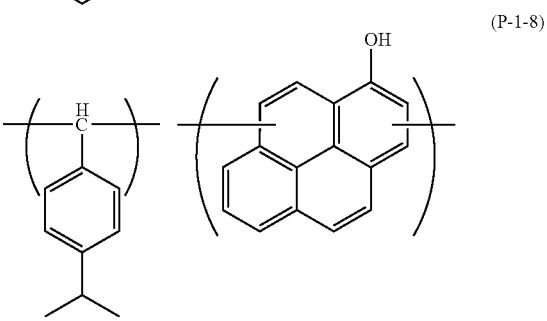

[Resin (P-2)]

Preferred examples of the resin (P) also include a resin (hereinafter referred to as "resin (P-2)") having a structural unit (u21) represented by the following general formula (u21-1), and a structural unit (u22) represented by the following general formula (u22-1).

In the formula, $R^{21}$ is an organic group derived from a phenol compound having at least one hydroxy group. $R^{22}$ is an aromatic hydrocarbon group having 6 to 30 carbon atoms which may have a substituent, or a hydrogen atom.

[Structural Unit (u21)]

The structural unit (u21) is a structural unit represented by the general formula (u21-1). In the general formula (u21-1), $R^{21}$ is an organic group derived from a phenol compound having at least one hydroxy group.

The phenol compound from which the organic group is derived, for $R^{21}$, is preferably a compound that can be condensed with an aldehyde to form a novolac resin or a resole resin. Examples of such a phenol compound include phenol; cresols such as m-cresol, p-cresol, o-cresol or the like; xylenols such as 2,3-xylenol, 2,5-xylenol, 3,5-xylenol, 3,4-xylenol or the like; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol or the like; alkoxyphenols such as p-methoxyphenol, m-methoxyphenol, p-ethoxyphenol, m-ethoxyphenol, p-propoxyphenol, m-propoxyphenol or the like; isopropenylphenols such as o-isopropenylphenol, p-isopropenylphenol, 2-methyl-4-isopropenylphenol, 2-ethyl-4-isopropenylphenol, or the like; arylphenols such as phenyl phenol or the like; polyhydroxyphenols such as 4,4'-dihydroxybiphenyl, bisphenol A, resorcinol, hydroquinone, pyrogallol, 9,9-bis (4-hydroxy-3,5-dimethylphenyl) fluorene, 9,9-bis (4-hydroxy-3-methylphenyl) fluorene, 1,1-bis (4-hydroxy-3-methylphenyl) cyclohexane, or the like; and the like.

From the viewpoint of solubility in the solvent, it is preferred that the phenol compound contains a phenol skeleton (benzene ring having at least one hydroxy group) but does not contain a bisnaphthol skeleton (a structure in which two naphthols are linked by a single bond or a divalent linking group).

Specific examples of the structural unit (u21) are shown below.

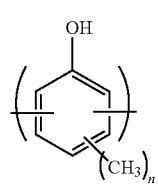

(u21-1-1)

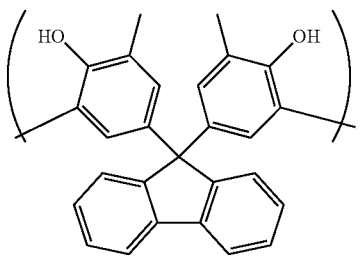

(u21-1-2)

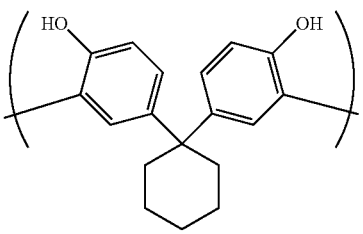

(u21-1-3)

In the formula (u21-1-1), n is an integer of 0 to 3.

The structural unit (u21) of the resin (P-2) may be one, or may be two or more.

A proportion of the structural unit (u21) in the resin (P-2) is preferably 30 to 70 mol %, based on the total sum of all structural units constituting the resin (P-2).

[Structural Unit (u22)]

The structural unit (u22) is a structural unit represented by the general formula (u22-1). In the general formula (u22-1), $R^{22}$ is an aromatic hydrocarbon group having 6 to 30 carbon atoms which may have a substituent, or a hydrogen atom. The aromatic hydrocarbon group preferably has 6 to 25 carbon atoms, more preferably 6 to 20 carbon atoms, still more preferably 6 to 15 carbon atoms.

In the case where the hydrocarbon group for $R^{22}$ is an aromatic hydrocarbon group, the aromatic hydrocarbon group is a hydrocarbon group having at least one aromatic ring. The aromatic ring is not particularly limited as long as it is a cyclic conjugated system having 4n+2 π electrons, and may be monocyclic or polycyclic. The aromatic ring preferably has 5 to 20 carbon atoms, more preferably 5 to 18 carbon atoms, still more preferably 6 to 16 carbon atoms.

Specific examples of the aromatic ring include an aromatic hydrocarbon ring such as benzene, naphthalene, anthracene, phenanthrene, pyrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring and the like.

Specific examples of the aromatic hydrocarbon group for $R^{22}$ include a group (an aryl group or a heteroaryl group) obtained by removing one hydrogen atom from the aromatic hydrocarbon ring or the aromatic heterocyclic ring; a group obtained by removing one hydrogen atom from an aromatic compound (for example, biphenyl, fluorene, and the like) containing two or more aromatic rings; a group (for example, an arylalkyl group such as benzyl, phenethyl, 1-naphthylmethyl, 2-naphthylmethyl, 1-naphthylethyl, 2-naphthylethyl and the like) in which one of hydrogen atoms of the aromatic hydrocarbon ring or the aromatic heterocyclic ring is substituted with an alkylene group; and the like. An alkylene group to be bonded to the aromatic hydrocarbon ring or the aromatic heterocyclic ring preferably has 1 to 4 carbon atoms, more preferably 1 to 2 carbon atoms, particularly preferably 1 carbon atom.

The aromatic hydrocarbon group for $R^{22}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms. Preferred examples of the substituent include a linear or branched alkyl group having 1 to 5 carbon atoms.

In particular, the structural unit (u22) is preferably a structural unit derived from an aldehyde compound. Specific examples of the aldehyde compound include formaldehyde, paraformaldehyde, trioxane, furfural, benzaldehyde, terephthalaldehyde, phenylacetaldehyde, α-phenylpropyl aldehyde, β-phenylpropyl aldehyde, o-hydroxy benzaldehyde, m-hydroxy benzaldehyde, p-hydroxy benzaldehyde, o-methyl benzaldehyde, m-methyl benzaldehyde, p-methyl benzaldehyde, o-chlorobenzaldehyde, m-chlorobenzaldehyde, p-chlorobenzaldehyde, cinnamaldehyde, 4-isopropyl benzaldehyde, 4-isobutyl benzaldehyde, 4-phenyl benzaldehyde and the like.

Specific examples of the structural unit (u22) are shown below.

(u22-1-1)

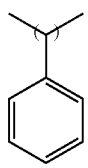
(u22-1-2)

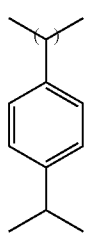
(u22-1-3)

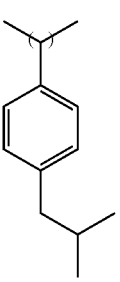
(u22-1-4)

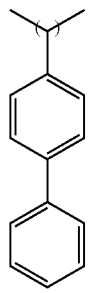
(u22-1-5)

The structural unit (u22) of the resin (P-2) may be one, or may be two or more.

A proportion of the structural unit (u22) in the resin (P-2) is preferably 30 to 70 mol %, based on the total sum of all structural units constituting the resin (P-2).

The resin (P-2) may contain other structural units in addition to the structural unit (u21) and the structural unit (u22). For example, a structural unit containing a hydrocarbon group is exemplified as the other structural units.

Examples of the resin (P-2) include a resin having the structural unit (u21) and the structural unit (u22), and the like. Examples of such a resin include a copolymer of a monomer from which the structural unit (u21) is derived and a monomer from the which the structural unit (u22) is derived, and the like.

In particular, the resin (P-2) is preferably a novolac resin or a resole resin, more preferably a novolac resin.

A mass average molecular weight (Mw) (based on polystyrene conversion by gel permeation chromatography (GPC)) of the resin (P-2) is not particularly limited, and is preferably about 1,000 to 100,000.

A dispersion degree (Mw/Mn) of the resin (P-2) is not particularly limited, and is preferably about 1 to 50. Mn represents a number average molecular weight.

The resin (P-2) may be used alone or in combination.

The resin (P-2) can be prepared by, for example, condensing the monomer from which the structural unit (u21) is derived and the monomer from which the structural unit (u22) is derived, in the presence of an acid catalyst or an alkali catalyst. A phenol compound can be typically used as the monomer from which the structural unit (u21) is derived. An aldehyde compound can be typically used as the monomer from which the structural unit (u22) is derived. The acid catalyst is not particularly limited, and examples thereof include hydrochloric acid, nitric acid, sulfuric acid, formic acid, oxalic acid, acetic acid and the like.

A commercially available novolac resin or resol resin may be used as the resin (P-2). Examples of commercially available novolac resin and resole resin include PR-53364, PR-53365 (collectively manufactured by Sumitomo Bakelite), and the like.

Specific examples of the resin (P-2) are shown below.

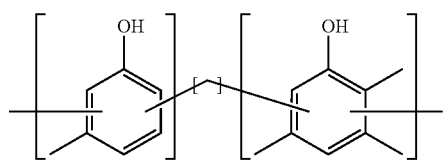
(P-2-1)

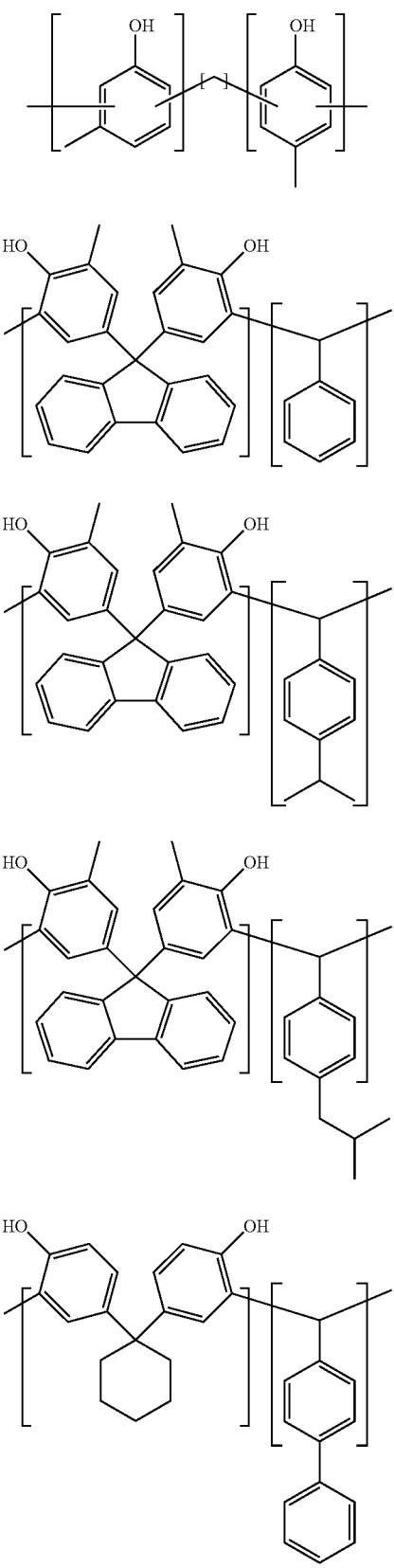

(P-2-2)

(P-2-3)

(P-2-4)

(P-2-5)

(P-2-6)

[Resin (P-3)]

Preferred examples of the resin (P) also include a resin (hereinafter referred to as "resin (P-3)") having a structural unit (u31) represented by the following general formula (u31-1).

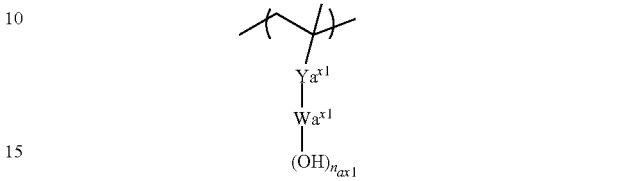

(u31-1)

In the formula, R is a hydrogen atom, an alkyl group having 1 to 5 carbon atoms, or a halogenated alkyl group having 1 to 5 carbon atoms. $Ya^{x1}$ is a single bond or a divalent linking group. $Wa^{x1}$ is a $(n_{ax1}+1)$-valent aromatic hydrocarbon group. $n_{ax1}$ is an integer of 1 to 3.

[Structural Unit (u31)]

The structural unit (u31) is a structural unit represented by the general formula (u31-1).

In the formula (u31-1), R is a hydrogen atom, an alkyl group having 1 to 5 carbon atoms, or a halogenated alkyl group having 1 to 5 carbon atoms.

The alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a penthyl group, an isopenthyl group, a neopenthyl group and the like. The halogenated alkyl group having 1 to 5 carbon atoms for R is a group in which a part or all of hydrogen atoms in the alkyl group having 1 to 5 carbon atoms are substituted with halogen atoms. Examples of the halogen atom include a fluorine atom, a chlorine atom, a bromine atom, an iodine atom and the like, and the fluorine atom is particularly preferred.

R is preferably a hydrogen atom, an alkyl group having 1 to 5 carbon atoms or a fluorinated alkyl group having 1 to 5 carbon atoms, most preferably a hydrogen atom or a methyl group from the viewpoint of industrial availability.

In the formula (u31-1), $Ya^{x1}$ is a single bond or a divalent linking group.

Suitable examples of the divalent linking group for $Ya^{x1}$ include a divalent hydrocarbon group which may have a substituent, a divalent linking group containing a hetero atom, and the like.

Divalent hydrocarbon group which may have a substituent:

In the case where $Ya^{x1}$ is a divalent hydrocarbon group which may have a substituent, the hydrocarbon group may be an aliphatic hydrocarbon group or an aromatic hydrocarbon group.

Aliphatic hydrocarbon group for $Ya^{x1}$

The aliphatic hydrocarbon group may be a saturated aliphatic hydrocarbon group or an unsaturated aliphatic hydrocarbon group, but typically, it is preferable that the aliphatic hydrocarbon group be an unsaturated aliphatic hydrocarbon group.

Examples of the aliphatic hydrocarbon group include a linear or branched aliphatic hydrocarbon group, an aliphatic hydrocarbon containing a ring in a structure, and the like.

Linear or branched aliphatic hydrocarbon group

The linear aliphatic hydrocarbon group preferably has 1 to 10 carbon atoms, more preferably 1 to 6 carbon atoms, still more preferably 1 to 4 carbon atoms, most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

The branched aliphatic hydrocarbon group preferably has 2 to 10 carbon atoms, more preferably 3 to 6 carbon atoms, still more preferably 3 or 4 carbon atoms, most preferably 3 carbon atoms.

The branched aliphatic hydrocarbon group is preferably a branched alkylene group, and specific examples thereof include an alkylalkylene group encompassing an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, —$C(CH_2CH_3)_2$— or the like; an alkylethylene group such as —$CH(CH_3)CH_2$—, —$CH(CH_3)CH(CH_3)$—, —$C(CH_3)_2CH_2$—, —$CH(CH_2CH_3)CH_2$—, —$C(CH_2CH_3)_2$—$CH_2$— or the like; an alkyltrimethylene group such as —$CH(CH_3)CH_2CH_2$—, —$CH_2CH(CH_3)CH_2$— or the like; an alkyltetramethylene group such as —$CH(CH_3)CH_2CH_2CH_2$—, —$CH_2CH(CH_3)CH_2CH_2$— or the like; and the like. The alkyl group for the alkylalkylene group is preferably a linear alkyl group having 1 to 5 carbon atoms.

The linear or branched aliphatic hydrocarbon group may or may not have a substituent. Examples of the substituent include a fluorine atom, a fluorinated alkyl group having 1 to 5 carbon atoms which is substituted with a fluorine atom, a carbonyl group and the like.

Aliphatic hydrocarbon group containing a ring in a structure

Examples of the aliphatic hydrocarbon group containing a ring in a structure include a cyclic aliphatic hydrocarbon group which contains a hetero atom in a ring structure and may have a substituent (a group obtained by removing two hydrogen atoms from an aliphatic hydrocarbon ring), a group in which the cyclic aliphatic hydrocarbon group is bonded to a terminal of a linear or branched aliphatic hydrocarbon group, a group in which the cyclic aliphatic hydrocarbon group intervenes on the way of a linear or branched aliphatic hydrocarbon group, and the like. Examples of the linear or branched aliphatic hydrocarbon group are the same as those listed above.

The cyclic aliphatic hydrocarbon group preferably has 3 to 20 carbon atoms, more preferably 3 to 12 carbon atoms.

The cyclic aliphatic hydrocarbon group may be a polycyclic aliphatic hydrocarbon group or a monocyclic aliphatic hydrocarbon group. The monocyclic aliphatic hydrocarbon group is preferably a group obtained by removing two hydrogen atoms from monocycloalkane. The monocycloalkane preferably has 3 to 6 carbon atoms, and specific examples thereof include cyclopentane, cyclohexane and the like. The polycyclic aliphatic hydrocarbon group is preferably a group obtained by removing two hydrogen atoms from polycycloalkane. The polycycloalkane preferably has 7 to 12 carbon atoms, and specific examples thereof include adamantane, norbornane, isobornane, tricyclodecane, tetracyclododecane and the like.

The cyclic aliphatic hydrocarbon group may or may not have a substituent. Examples of the substituent include an alkyl group, an alkoxy group, a halogen atom, a halogenated alkyl group, a hydroxyl group, a carbonyl group and the like.

The alkyl group as the substituent is preferably an alkyl group having 1 to 5 carbon atoms, most preferably a methyl group, an ethyl group, a propyl group, an n-butyl group or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, more preferably a methoxy group or an ethoxy group.

Examples of the halogen atom as the substituent include a fluorine atom, a chlorine atom, a bromine atom, an iodine atom and the like, among which the fluorine atom is preferred.

Examples of the halogenated alkyl group as the substituent include a group in which a part or all of hydrogen atoms in the alkyl group are substituted with halogen atoms.

A part of carbon atoms constituting the ring structure of the cyclic aliphatic hydrocarbon group may be substituted with a substituent containing a hetero atom. Preferred examples of the substituent containing a hetero atom include —O—, —C(=O)—O—, —S—, —S(=O)$_2$—, and —S(=O)$_2$—O—.

Aromatic hydrocarbon group for Ya$^{x1}$

The aromatic hydrocarbon group is a hydrocarbon group having at least one aromatic ring.

The aromatic ring is not particularly limited as long as it is a cyclic conjugated system having 4n+2π electrons, and may be monocyclic or polycyclic. The aromatic ring preferably has 5 to 30 carbon atoms, more preferably 5 to 20 carbon atoms, still more preferably 6 to 15 carbon atoms, particularly preferably 6 to 12 carbon atoms. The carbon atoms contained in the substituent are not counted. Specific examples of the aromatic ring include an aromatic hydrocarbon ring such as benzene, naphthalene, anthracene, phenanthrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyridine ring, a thiophene ring and the like.

Specific examples of the aromatic hydrocarbon group include a group (an arylene group or a heteroarylene group) obtained by removing two hydrogen atoms from the aromatic hydrocarbon ring or the aromatic heterocyclic ring; a group obtained by removing two hydrogen atoms from an aromatic compound (for example, biphenyl, fluorene, and the like) containing two or more aromatic rings; a group in which one of hydrogen atoms of a group (an aryl group or a hetero group) obtained by removing one hydrogen atom from the aromatic hydrocarbon ring or the aromatic heterocyclic ring is substituted with an alkylene group (for example, a group obtained by further removing one hydrogen atom from an aryl group in an arylalkyl group such as a benzyl group, a phenethyl group, an 1-naphthylmethyl group, a 2-naphthylmethyl group, an 1-naphthylethyl group, 2-naphthylethyl group and the like); and the like. An alkylene group to be bonded to the aryl group or the heteroaryl group preferably has 1 to 4 carbon atoms, more preferably 1 to 2 carbon atoms, most preferably 1 carbon atom.

A hydrogen atom of the aromatic hydrocarbon group may be substituted with a substituent. For example, a hydrogen atom to be bonded to the aromatic ring in the aromatic hydrocarbon group may be substituted with a substituent. Examples of the substituent include an alkyl group, an alkoxy group, a halogen atom, a halogenated alkyl group, a hydroxyl group and the like.

The alkyl group as the substituent is preferably an alkyl group having 1 to 5 carbon atoms, most preferably a methyl group, an ethyl group, a propyl group, an n-butyl group or a tert-butyl group.

Examples of the alkoxy group, the halogen atom and the halogenated alkyl group as the substituent include the same as those listed as the substituent with which a hydrogen atom of the cyclic aliphatic hydrocarbon group is substituent.

Divalent linking group containing a hetero atom:

In the case where $Ya^{x1}$ is the divalent linking group containing a hetero atom, preferred examples of the linking group include —O—, —C(=O)—O—, —C(=O)—, O—C(=O)—O—, —C(=O)—NH—, —NH—, —NH—C(=NH)— (wherein H may be substituted with a substituent such as an alkyl group, an acyl group or the like), —S—, —S(=O)$_2$—, —S(=O)$_2$—O—, a group represented by the general formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— (in the formulae, Y$^{21}$ and Y$^{22}$ each independently represents a divalent hydrocarbon group which may have a substituent, O is an oxygen atom, and m'' is an integer of 0 to 3), and the like.

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8 carbon atoms, particularly preferably 1 to 5 carbon atoms.

In the general formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represents a divalent hydrocarbon group which may have a substituent. Examples of the divalent hydrocarbon group include the same as those listed as the divalent linking group (a divalent hydrocarbon group may have a substituent).

Y$^{21}$ is preferably a linear aliphatic hydrocarbon group, more preferably a linear alkylene group, still more preferably a linear alkylene group having 1 to 5 carbon atoms, particularly preferably a methylene group or an ethylene group.

Y$^{22}$ is preferably a linear or branched aliphatic hydrocarbon group, more preferably a methylene group, an ethylene group or an alkylmethylene group. An alkyl group in the alkylmethylene group is preferably a linear alkyl group having 1 to 5 carbon atoms, more preferably a linear alkyl group having 1 to 3 carbon atoms, most preferably a methyl group.

In the group represented by the formula —[Y$^{21}$—C(=O)—O]$_{m''}$—Y$^{22}$—, m'' is an integer of 0 to 3, preferably an integer of 0 to 2, more preferably 0 or 1, particularly preferably 1. That is, a group represented by the formula —Y$^{21}$—C(=O)—O—Y$^{22}$— is particularly preferable as the group represented by the formula —[Y$^{21}$—C(=O)—O]$_{m''}$—Y$^{22}$—. Among those, a group represented by the formula —(CH$_2$)$_{a'}$—C(=O)—O—(CH$_2$)$_{b'}$— is preferred. In the formula, a' is an integer of 1 to 10, preferably an integer of 1 to 8, more preferably an integer of 1 to 5, still more preferably 1 or 2, most preferably 1. b' is an integer of 1 to 10, preferably an integer of 1 to 8, more preferably an integer of 1 to 5, still more preferably 1 or 2, most preferably 1.

$Ya^{x1}$ is preferably a single bond, an ester bond [—C(=O)—O—], an ether bond (—O—), —C(=O)—NH—, a linear or branched alkylene group or combinations thereof, among which the single bond is most preferred.

In the formula (u31-1), $Wa^{x1}$ is a ($n_{ax1}$+1)-valent aromatic hydrocarbon group.

Examples of the aromatic hydrocarbon group for $Wa^{x1}$ include a group obtained by removing ($n_{ax1}$+1) hydrogen atoms from an aromatic ring. The aromatic ring is not particularly limited as long as it is a cyclic conjugated system having 4n+2π electrons, and may be monocyclic or polycyclic. The aromatic ring preferably has 5 to 30 carbon atoms, more preferably 5 to 20 carbon atoms, still more preferably 6 to 15 carbon atoms, particularly preferably 6 to 12 carbon atoms. Specific examples of the aromatic ring include an aromatic hydrocarbon ring such as benzene, naphthalene, anthracene, phenanthrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyridine ring, a thiophene ring and the like.

In the formula (u31-1), $n_{ax1}$ is an integer of 1 to 3, preferably 1 or 2, more preferably 1.

Specific examples of the structural unit (u31) are shown below.

In the following formula, $R^α$ represents a hydrogen atom, a methyl group or a trifluoromethyl group.

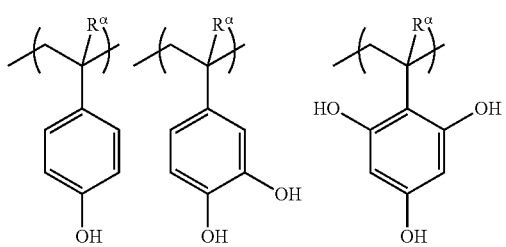

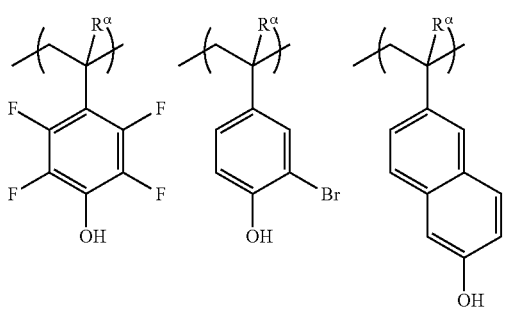

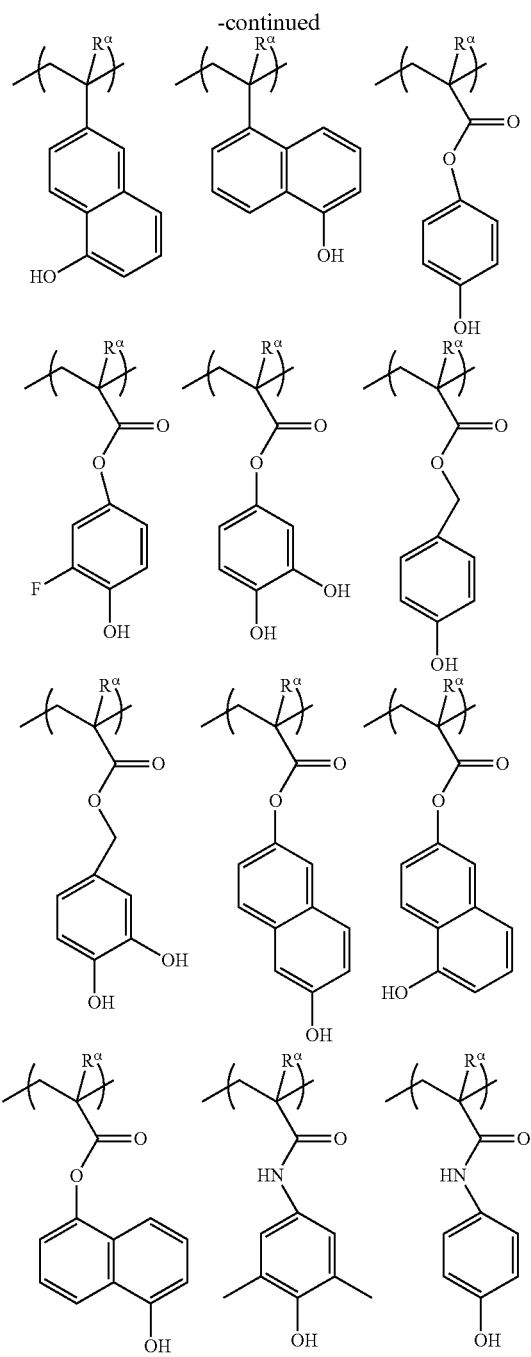

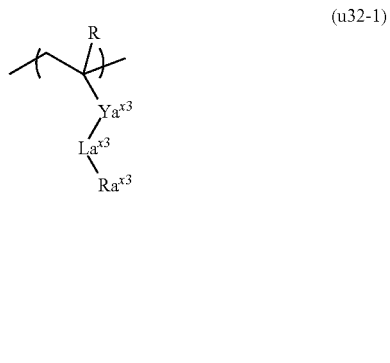

(u32-1)

In the formula, R is a hydrogen atom, an alkyl group having 1 to 5 carbon atoms or a halogenated alkyl group having 1 to 5 carbon atoms. $Ya^{x3}$ is a single bond or a divalent linking group. $La^{x3}$ is —O—, —COO—, —CON(R')—, —OCO—, —CONHCO— or CONHCS—. R' represents a hydrogen atom or a methyl group, provided that $Ya^{x3}$ is not —CO— in the case where $La^{x3}$ is —O—. $Ra^{x3}$ is a hydrogen atom, or a hydrocarbon group which may have a substituent.

In the formula (u32-1), R is defined the same as R in the formula (u31-1).

In the formula (u32-1), $Ya^{x3}$ is a single bond or a divalent linking group.

Examples of the divalent linking group for $Ya^{x3}$ include the same as those listed as the divalent linking group for $Ya^{x1}$ in the general formula (u31-1) stated above. Among those, $Ya^{x3}$ is preferably a single bond, an ester bond [—C(=O)—O—, —O—C(=O)—], an ether bond (—O—), a linear or branched alkylene group or combinations thereof.

In the formula (u32-1), $La^{x3}$ is —O—, —COO—, —CON(R')—, —OCO—, —CONHCO— or CONHCS—. R' represents a hydrogen atom or a methyl group in the formula stated above, provided that $Ya^{x3}$ is not —CO— in the case where $La^{x3}$ is —O—.

In the formula (u32-1), $Ra^{x3}$ is a hydrogen atom, or a hydrocarbon group which may have a substituent. The hydrocarbon group for $Ra^{x3}$ preferably has 1 to 20 carbon atoms, and examples thereof include the same as those listed as the hydrocarbon group for $R^{13}$ in the general formula (u13-1). Among those, the hydrocarbon group for $Ra^{x3}$ is preferably a linear or branched alkyl group having 1 to 10 carbon atoms, more preferably a linear or branched alkyl group having 1 to 5 carbon atoms, still more preferably a linear or branched alkyl group having 1 to 3 carbon atoms.

The hydrocarbon group for $Ra^{x3}$ may or may not have a substituent. Examples of the substituent include the same as those listed as the substituent of the linear or branched aliphatic hydrocarbon group for $R^{13}$ in the general formula (u13-1), the aliphatic hydrocarbon group containing a ring in a structure, and the aromatic hydrocarbon group, respectively.

Specific examples of the structural unit (u32) are shown below.

In the following formulae, $R^{\alpha}$ represents a hydrogen atom, a methyl group or trifluoromethyl group.

The structural unit (u31) of the resin (P-3) may be one, or may be two or more.

A proportion of the structural unit (u31) in the resin (P-3) is preferably 30 to 100 mol %, more preferably 50 to 100 mol %, still more preferably 60 to 100 mol %, based on the total sum of all structural units constituting the resin (P-3).

In the case where the proportion of the structural unit (u31) is at least the lower limit value of the preferable range stated above, etching resistance is improved.

[Other Structural Units]

The resin (P-3) may contain other structural units in addition to the structural unit (u31). Examples of the other structural unit include a structural unit (u32) represented by the following general formula (u32-1).

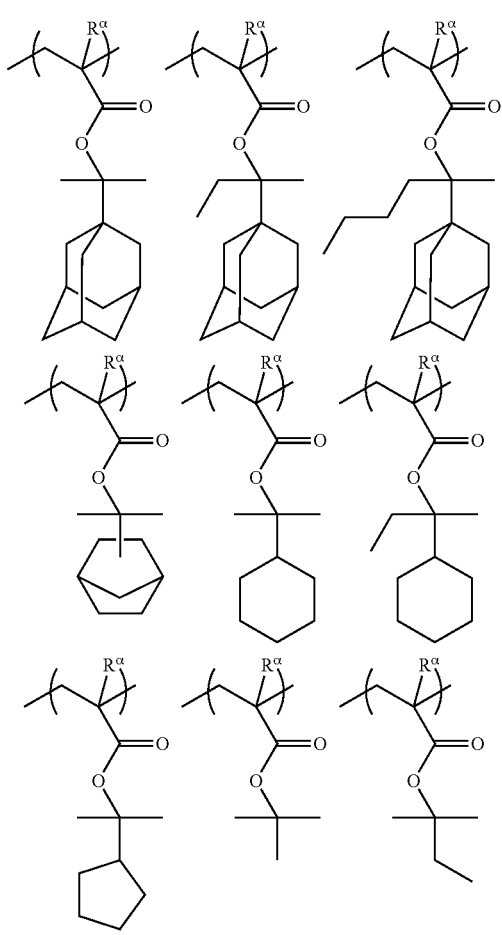
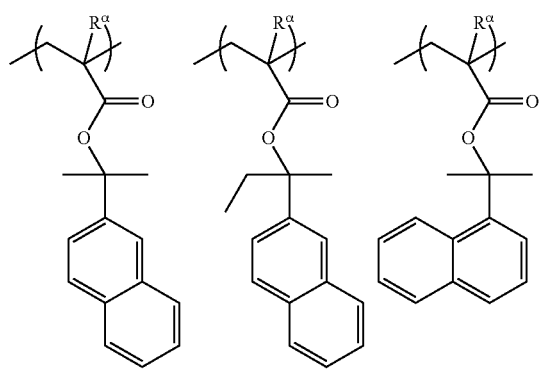
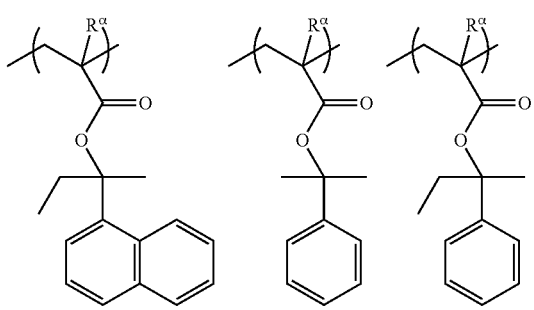
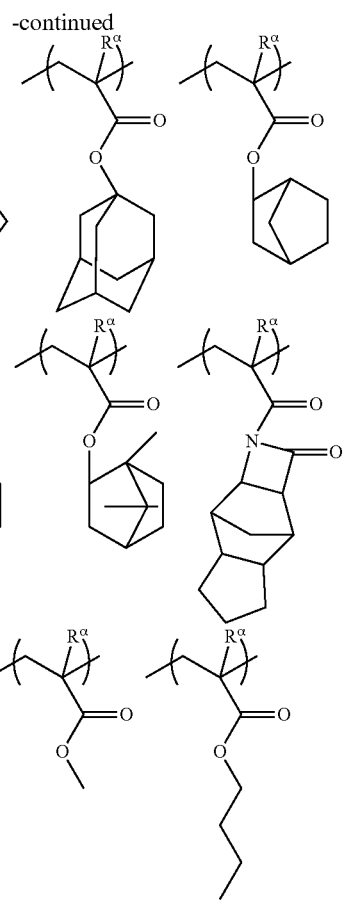

The structural unit (u32) of the resin (P-3) may be one, or may be two or more.

A proportion of the structural unit (u32) in the resin (P-3) is preferably 0 to 60 mol %, more preferably 0 to 50 mol %, still more preferably 0 to 40 mol %, based on the total sum of all structural units constituting the resin (P-3).

In the case where the proportion of the structural unit (u32) is equal to or less than the upper limit value of the preferable range stated above, etching resistance is improved.

The resin (P-3) may contain a structural unit other than the structural unit (u32) as the other structural units. A structural unit with a high carbon amount is preferred as such a structural unit from the viewpoint of etching resistance. For example, a structural unit (except for those corresponding to any one of the structural units (u31) and (u32)) containing an aromatic hydrocarbon group is exemplified.

Examples of the resin (P-3) include a resin having the structural unit (u31), a resin having the structural unit (u31) and the structural unit (u32), and the like.

Examples of such a resin include a copolymer of a monomer from which the structural unit (u31) is derived; a copolymer of a monomer from which the structural unit (u31) is derived and a monomer from which the structural unit (u32) is derived; and the like.

A mass average molecular weight (Mw) (based on polystyrene conversion by gel permeation chromatography (GPC)) of the resin (P-3) is not particularly limited, and is preferably about 1,000 to 500,000, more preferably about 3,000 to 50,000. Excellent etching resistance and heat resistance are obtained as Mw of the resin (P-3) falls within the preferable range stated above.

A dispersion degree (Mw/Mn) of the resin (P-3) is not particularly limited, and is preferably about 1.0 to 4.0, more preferably about 1.0 to 3.0. Mn represents a number average molecular weight.

The resin (P-3) may be used alone or in combination.

The resin (P-3) can be prepared by dissolving the monomers from which respective structural units are derived in a polymerization solvent, adding a radical polymerization initiator such as azobisisobutyronitrile (AIBN), azobisisobutyric acid dimethyl (for example, V-601 or the like) or the like to the dissolved monomers, and polymerizing a mixture.

Specific but non-limiting examples of the resin (P-3) are shown below. In the following formulae, $R^\alpha$ represents a hydrogen atom, a methyl group or a trifluoromethyl group.

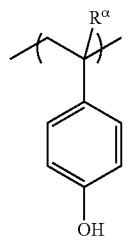

(P-3-1)

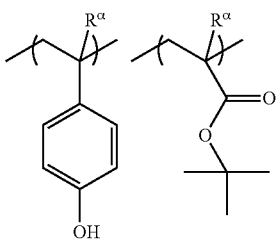

(P-3-2)

The resin (P) may be used alone or in combination. For example, the resin (P-1), the resin (P-2) and the resin (P-3) may be used alone in combination as the resin (P).

Examples of the resin (P) include a resin containing the resin (P-1); a resin containing the resin (P-2); a resin containing the resin (P-3); a resin containing the resin (P-1) and the resin (P-2); a resin containing the resin (P-1) and the resin (P-3); a resin containing the resin (P-2) and the resin (P-3); a resin containing the resin (P-1), the resin (P-2) and the resin (P-3); and the like.

A proportion of the resin (P) in the hard mask-forming composition is preferably 70 to 100 mass %, more preferably 80 to 100 mass %, still more preferably 90 to 100 mass %, particularly preferably 95 to 100 mass %, most preferably 100 mass %, based on the total mass of all resins contained in the hard mask-forming composition. In the case where the proportion is at least the lower limit value of the preferable range stated above, etching resistance and embeddability of the hard mask-forming composition are improved.

<Compound (OF)>

A compound (OF) is a compound containing at least one structure selected from the group consisting of an oxazine ring fused to an aromatic ring, and a fluorene ring.

The compound (OF) may be a compound containing an oxazine ring fused to an aromatic ring, a compound containing a fluorene ring, or a compound containing an oxazine ring fused to an aromatic ring and a fluorene ring.

[Compound Containing Oxazine Ring Fused to Aromatic Ring]

Examples of the compound containing an oxazine ring fused to an aromatic ring include a compound (O1) containing a structure represented by the following general formula (o1-1).

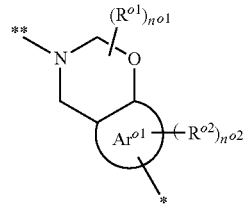

(o1-1)

In the formula, $R^{o1}$ is a hydrocarbon group having 1 to 20 carbon atoms which may have a substituent. $Ar^{o1}$ represents a monocyclic or polycyclic aromatic hydrocarbon ring having 6 to 20 carbon atoms. $R^{o2}$ is a hydroxy group, a halogen atom, a nitro group, or a hydrocarbon group having 1 to 20 carbon atoms which may have a substituent. no1 is an integer of 0 to 4. In the case where no1 is an integer of 2 or more, a plurality of $R^{o1}$s may be the same or different. $n^{o2}$ is an integer of 0 to 3. In the case where $n^{o2}$ is an integer of 2 or more, a plurality of $R^{o2}$s may be the same or different, and two or more of the plurality of $R^{o2}$s may be bonded to each other to form a 4- to 20-membered ring structure together with the carbon atom in $Ar^{o1}$ to which they are bonded. The marks "*" and "**" each independently represents a hydrogen atom or a bond.

In the general formula (o1-1), $R^{o1}$ is a hydrocarbon group having 1 to 20 carbon atoms which may have a substituent.

Examples of the hydrocarbon group having 1 to 20 carbon atoms for $R^{o1}$ include the same as those listed as the hydrocarbon group having 1 to 20 carbon atoms for $R^{13}$ in the general formula (u13-1).

Among those, the hydrocarbon group for $R^{o1}$ is a linear or branched aliphatic hydrocarbon group having 1 to 10 carbon atoms, more preferably a linear or branched alkyl group having 1 to 10 carbon atoms. The linear or branched alkyl group preferably has 1 to 5 carbon atoms, more preferably 1 to 3 carbon atoms, still more preferably 1 or 2 carbon atoms.

The hydrocarbon group having 1 to 20 carbon atoms for $R^{o1}$ may or may not have a substituent. Examples of the substituent include the same as those listed as the substituent of the linear or branched aliphatic hydrocarbon group for $R^{13}$ in the general formula (u13-1), the aliphatic hydrocarbon group containing a ring in a structure, and the aromatic hydrocarbon group, respectively.

In the general formula (o1-1), $Ar^{o1}$ represents a monocyclic or polycyclic aromatic hydrocarbon ring having 6 to 20 carbon atoms. $Ar^{o1}$ preferably has 6 to 14 carbon atoms, more preferably 6 to 10 carbon atoms.

Examples of the aromatic hydrocarbon ring include benzene, naphthalene, anthracene, phenanthrene, tetracene, pyrene, triphenylene, perylene and the like. Among these, the aromatic hydrocarbon ring for $Ar^{o1}$ is preferably benzene or naphthalene, more preferably benzene.

In the general formula (o1-1), $R^{o2}$ is a hydroxy group, a halogen atom, a nitro group, or a hydrocarbon group having 1 to 20 carbon atoms which may have a substituent.

Examples of the hydrocarbon group having 1 to 20 carbon atoms for $R^{o2}$ include the same as those listed as the hydrocarbon group having 1 to 20 carbon atoms for $R^{13}$ in the general formula (u13-1). Among those, the hydrocarbon carbon for $R^{o2}$ is preferably a linear or branched aliphatic hydrocarbon group having 1 to 10 carbon atoms, more preferably a linear or branched alkyl group having 1 to 10 carbon atoms. The linear or branched alkyl group preferably has 1 to 5 carbon atoms, more preferably 1 to 3 carbon atoms, still more preferably 1 or 2 carbon atoms.

The hydrocarbon group having 1 to 20 carbon atoms for $R^{o2}$ may or may not have a substituent. Examples of the substituent include the same as those listed as the substituent of the linear or branched aliphatic hydrocarbon group for $R^{13}$ in the general formula (u13-1), the aliphatic hydrocarbon group containing a ring in a structure, and the aromatic hydrocarbon group, respectively.

$R^{o2}$ is preferably a linear or branched alkyl group having 1 to 20 carbon atoms, more preferably 1 to 5 carbon atoms, still more preferably 1 to 3 carbon atoms, further preferably 1 or 2 carbon atoms.

In the general formula (o1-1), $n^{o1}$ is an integer of 0 to 4. In the case where $n^{o1}$ is an integer of 2 or more, a plurality of $R^{o1}$s may be the same or different.

$n^{o1}$ is preferably an integer of 0 to 3, more preferably an integer of 0 to 2, still more preferably 0 or 1, particularly preferably 0.

In the general formula (o1-1), $n^{o2}$ is an integer of 0 to 3. In the case where $n^{o2}$ is an integer of 2 or more, a plurality of $R^{o2}$s may be the same or different, and two or more of the plurality of $R^{o2}$s may be bonded to each other to form a 4- to 20-membered ring structure together with the carbon atom in $Ar^{o1}$ to which they are bonded. Examples of the ring structure include an alicyclic structure such as a cyclohexane ring, a cyclohexene ring or the like; an aliphatic heterocyclic structure such as an azacyclohexane ring, an azacyclohexene ring or the like; an aromatic heterocyclic structure such as a pyridine ring or the like; and the like.

$n^{o2}$ is more preferably an integer of 0 to 2, still more preferably 0 or 1, particularly preferably 0.

In the general formula (o1-1), the marks "*" and "**" each independently represents a hydrogen atom or a bond. The bond represents a bond to an atom other than the structure represented by the general formula (o1-1).

In the case where $Ar^{o1}$ in the general formula (o1-1) is a benzene ring, a position of —O— in the oxazine ring may be any of the para-, meta-, and ortho-positions in the benzene ring with respect to the bond represented by the mark "*" in the formula; the para-position is preferred from the viewpoint of easier synthesis of the compound (O1). Further, in the case where $Ar^{o1}$ is a naphthalene ring and the bond represented by the mark "*" in the formula is at the position 2 of the naphthalene ring, the position of —O— in the oxazine ring is preferably the position 6 of the naphthalene ring.

Preferred examples of the compound (O1) include a compound containing a structure represented by the following general formula (o1-1-1) (hereinafter referred to as "compound (O1-1)") and a compound containing a structure represented by the following general formula (o1-1-2) (hereinafter referred to as "compound (O1-2)").

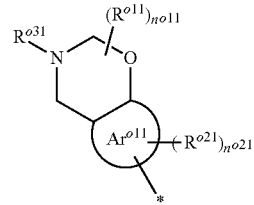

(o1-1-1)

In the formula, $R^{o11}$ is a hydrocarbon group having 1 to 20 carbon atoms which may have a substituent. $Ar^{o11}$ represents a monocyclic or polycyclic aromatic hydrocarbon ring having 6 to 20 carbon atoms. $R^{o21}$ is a hydroxy group, a halogen atom, a nitro group, or a hydrocarbon group having 1 to 20 carbon atoms which may have a substituent. $n^{o11}$ is an integer of 0 to 4. In the case where $n^{o11}$ is an integer of 2 or more, a plurality of $R^{o11}$s may be the same or different. $n^{o21}$ is an integer of 0 to 3. In the case where $n^{o21}$ is an integer of 2 or more, a plurality of $R^{o21}$s may be the same or different, and two or more of the plurality of $R^{o21}$s may be bonded to each other to form a 4- to 20-membered ring structure together with the carbon atom in $Ar^{o11}$ to which they are bonded. $R^{o31}$ is a hydrogen atom, or a hydrocarbon group having 1 to 20 carbon atoms which may have a substituent. The mark "*" represents a bond.

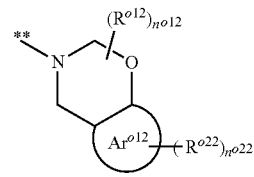

(o1-1-2)

In the formula, $R^{o12}$ is a hydrocarbon group having 1 to 20 carbon atoms which may have a substituent. $Ar^{o12}$ represents a monocyclic or polycyclic aromatic hydrocarbon ring having 6 to 20 carbon atoms. $R^{o22}$ is a hydroxy group, a halogen atom, a nitro group, or a hydrocarbon group having 1 to 20 carbon atoms which may have a substituent. $n^{o12}$ is an integer of 0 to 4. In the case where $n^{o12}$ is an integer of 2 or more, a plurality of $R^{o12}$s may be the same or different. $n^{o22}$ is an integer of 0 to 4. In the case where $n^{o22}$ is an integer of 2 or more, a plurality of $R^{o22}$s may be the same or different, and two or more of the plurality of $R^{o22}$s may be bonded to each other to form a 4- to 20-membered ring structure together with the carbon atom in $Ar^{o12}$ to which they are bonded. The mark "**" represents a bond.

In the general formula (o1-1-1) and the general formula (o1-1-2), $R^{o11}$ and $R^{o12}$ each independently represents a hydrocarbon group having 1 to 20 carbon atoms which may have a substituent. Examples of $R^{o11}$ and $R^{o12}$ include the same as those listed for $R^{o1}$ in the general formula (o1-1).

In the general formula (o1-1-1), $Ar^{o11}$ represents a monocyclic or polycyclic aromatic hydrocarbon ring having 6 to 20 carbon atoms. In the general formula (o1-1-2), $Ar^{o12}$ represents a monocyclic or polycyclic aromatic hydrocarbon ring having 6 to 20 carbon atoms. $Ar^{o11}$ and $Ar^{o12}$ each have preferably 6 to 14 carbon atoms, more preferably 6 to 10 carbon atoms. Examples of $Ar^{o11}$ and $Ar^{o12}$ include the same as those listed for $Ar^{o1}$ in the general formula (o1-1).

In the general formula (o1-1-1) and the general formula (o1-1-2), $R^{o21}$ and $R^{o22}$ each independently represents a hydroxy group, a halogen atom, a nitro group, or a hydrocarbon group having 1 to 20 carbon atoms which may have a substituent. Examples of $R^{o21}$ and $R^{o22}$ include the same as those listed for $R^{o2}$ in the general formula (o1-1).

In the general formula (o1-1-1) and the general formula (o1-1-2), $n^{o11}$ and $n^{o12}$ each represent an integer of 0 to 4. In the case where $n^{o11}$ is an integer of 2 or more, a plurality of $R^{o11}$s may be the same or different. In the case where $n^{o12}$ is an integer of 2 or more, a plurality of $R^{o12}$s may be the same or different.

In the general formula (o1-1-1), $n^{o21}$ is an integer of 0 to 3, preferably an integer 0 to 2, more preferably 0 or 1, still more preferably 0. In the case where $n^{o21}$ is an integer of 2 or more, a plurality of $R^{o21}$s may be the same or different, and two or more of the plurality of $R^{o21}$s may be bonded to each other to form a 4- to 20-membered ring structure together with the carbon atom in $Ar^{o11}$ to which they are bonded. Examples of the ring structure include the same as those listed for $R^{o2}$ in the general formula (o1-1).

In the general formula (o1-1-2), $n^{o22}$ is an integer of 0 to 4, preferably an integer of 0 to 3, more preferably an integer of 0 to 2, still more preferably 0 or 1, particularly preferably 0. In the case where $n^{o22}$ is an integer of 2 or more, a plurality of $R^{o22}$s may be the same or different, and two or more of the plurality of $R^{o22}$s may be bonded to each other to form a 4- to 20-membered ring structure together with the carbon atom in $Ar^{o12}$ to which they are bonded. Examples of the ring structure include the same as those listed for $R^{o2}$ in the general formula (o1-1).

In the general formula (o-1-1), $R^{o31}$ is a hydrogen atom, or a hydrocarbon group having 1 to 20 carbon atoms which may have a substituent.

Examples of the hydrocarbon group having 1 to 20 carbon atoms for $R^{o31}$ include the same as those listed as the hydrocarbon group having 1 to 20 carbon atoms for $R^{13}$ in the general formula (u13-1).

The hydrocarbon group having 1 to 20 carbon atoms for $R^{o31}$ may or may not have a substituent.

In the case where the hydrocarbon group having 1 to 20 carbon atoms for $R^{o31}$ is a linear or branched aliphatic hydrocarbon group, examples of the substituent include a hydroxy group, a carboxy group, an alkoxy group, a cyano group, a halogen atom and the like. Examples of the halogen atom include a fluorine atom, a chlorine atom, a bromine atom, an iodine atom and the like, among which the fluorine atom is preferred.

Further, the substituent may be a group for substituting a methylene group (—$CH_2$—) of an aliphatic hydrocarbon chain. Examples of such a substituent include —O—, —C(=O)—O—, —C(=O)—, —O—C(=O)—O—, —C(=O)—NH—, —NH—, —NH—C(=NH)— (wherein H may be substituted with a substituent such as an alkyl group, an acyl group or the like), —S—, —S(=O)$_2$—, —S(=O)$_2$—O—, and the like.

In the case where the hydrocarbon group having 1 to 20 carbon atoms for $R^{o31}$ is an aliphatic hydrocarbon group containing a ring in a structure, examples of the substituent include a hydroxy group, a carboxy group, a cyano group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms. The halogen atom for the substituent is preferably a fluorine atom.

Further, the substituent may be a substituent with which a part of carbon atoms constituting an alicyclic structure is substituted. Examples of the substituent include —O—, —C(=O)—O—, —S—, —S(=O)$_2$—, —S(=O)$_2$—O—, —N— and the like.

In the case where the hydrocarbon group having 1 to 20 carbon atoms for $R^{o31}$ is an aromatic hydrocarbon group, examples of the substituent include a hydroxy group, a carboxy group, a cyano group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms. The halogen atom for the substituent is preferably a fluorine atom.

The hydrocarbon group having 1 to 20 carbon atoms for $R^{o31}$ is preferably an aromatic hydrocarbon group having 5 to 20 carbon atoms which may have a substituent, more preferably an aromatic hydrocarbon group having 6 to 16 carbon atoms.

Specific examples of $R^{o31}$ include an alkyl group having 1 to 5 carbon atoms (such as a methyl group, an ethyl group, a propyl group, an isopropyl group, an n-butyl group, an isobutyl group, a tert-butyl group, a penthyl group, an isopenthyl group, a neopenthyl group or the like), an alkoxy group having 1 to 5 carbon atoms (such as a methoxy group, an ethoxy group, a propoxy group, a butoxy group or the like); an alkoxyalkyl group having 1 to 5 carbon atoms (such as a methoxyethyl group, a methoxyethyl group, a methoxypropyl group, a methoxybutyl group or the like), a cyanoalkyl group having 1 to 5 carbon atoms (such as a cyanomethyl group, a cyanoethyl group, a cyanopropyl group, a cyanobutyl group or the like), an aryl group (such as a phenyl group, a naphthyl group or the like), an aralkyl group (such as a benzyl group, a naphthylmethyl group or the like), a halogenated aryl group (such as monofluorophenyl group, monofluoronaphthyl group, difluorophenyl group, difluoronaphthyl group or the like), a halogenated aralkyl groups (such as a difluorobenzyl group, a difluoronaphthyl methyl group or the like), a furyl group, and the like.

Among those, $R^{o31}$ is preferably an aryl group, more preferably a phenyl group or a naphthyl group, still more preferably a phenyl group.

Preferred examples of the compound (O1-1) include a compound represented by the following general formula (o1-1-1a).

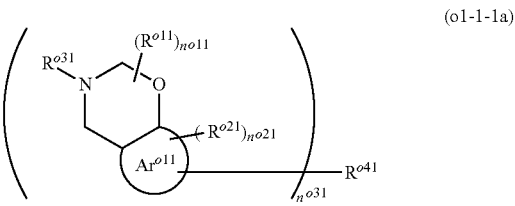

(o1-1-1a)

In the formula, $R^{o11}$, $Ar^{o11}$, $R^{o21}$, $n^{o11}$, $n^{o21}$ and $R^{o31}$ are defined the same as those in the general formula (o1-1-1). $n^{o31}$ represents an integer of 1 to 5. $R^{o41}$ represents an $n^{o31}$-valent hydrocarbon group which may have a substituent.

In the general formula (o1-1-1a), $n^{o31}$ represents an integer of 1 to 5. $n^{o31}$ is preferably an integer of 2 to 5, more preferably an integer of 2 to 4, still more preferably 2 or 3.

In the general formula (o1-1-1a), $R^{o41}$ represents an $n^{o31}$-valent hydrocarbon group which may have a substituent.

The $n^{o31}$-valent hydrocarbon group for $R^{o41}$ preferably has 1 to 30 carbon atoms.

The $n^{o31}$-valent hydrocarbon group for $R^{o41}$ may be an aliphatic hydrocarbon group or an aromatic hydrocarbon group.

The aliphatic hydrocarbon group may be a saturated aliphatic hydrocarbon group or an unsaturated aliphatic hydrocarbon group, but typically, it is preferable that the aliphatic hydrocarbon group be an unsaturated aliphatic hydrocarbon group. Examples of the aliphatic hydrocarbon group include a linear or branched aliphatic hydrocarbon group, an aliphatic hydrocarbon group containing a ring in a structure, and the like.

The linear or branched aliphatic hydrocarbon group preferably has 1 to 30 carbon atoms, more preferably 1 to 20 carbon atoms, still more preferably 1 to 15 carbon atoms, further preferably 1 to 10 carbon atoms, particularly preferably 1 to 6 carbon atoms. The linear or branched aliphatic hydrocarbon group may be a saturated aliphatic hydrocarbon group or an unsaturated aliphatic hydrocarbon group, but the saturated aliphatic hydrocarbon group is preferred. Examples of the linear or branched aliphatic hydrocarbon group include a group obtained by removing $n^{o31}$-1 hydrogen atoms from those listed for $R^{13}$ in the general formula (u13-1).

The linear or branched aliphatic hydrocarbon group may or may not have a substituent. Examples of the substituent include a hydroxy group, an oxo group, an alkoxy group, a nitro group, a halogen atom and the like.

Further, the substituent may be a group for substituting a methylene group (—CH$_2$—) of an aliphatic hydrocarbon chain. Examples of such a substituent include —O—, —C(=O)—O—, —C(=O)—, —O—C(=O)—O—, —C(=O)—NH—, —NH—, —NH—C(=NH)— (wherein H may be substituted with a substituent such as an alkyl group, an acyl group or the like), —S—, —S(=O)$_2$—, —S(=O)$_2$—O—, and the like.

Examples of the aliphatic hydrocarbon group containing a ring in a structure include an alicyclic hydrocarbon group (a group obtained by removing $n^{o31}$ hydrogen atoms from an aliphatic hydrocarbon ring), an group obtained removing $n^{o31}$-1 hydrogen atoms from a group in which one of hydrogen atoms in an aliphatic hydrocarbon ring is substituted with an alkylene group, a group in which $n^{o31}$ hydrogen atoms in an aliphatic hydrocarbon ring are substituted with alkylene groups, and the like. The alkylene group preferably has 1 to 4 carbon atoms. The aliphatic hydrocarbon ring preferably has 3 to 10 carbon atoms, more preferably 3 to 6 carbon atoms. The aliphatic hydrocarbon ring may be polycyclic or monocyclic. Examples of the aliphatic hydrocarbon ring include the same as those listed for $R^{13}$ in the general formula (u13-1).

The cyclic aliphatic hydrocarbon group may or may not have a substituent. Examples of the substituent include a hydroxy group, a carbonyl group, an alkoxy group, a nitro group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms.

Further, the substituent may be a substituent with which a part of carbon atoms constituting an alicyclic structure is substituted. Examples of the substituent include —O—, —C(=O)—O—, —S—, —S(=O)$_2$—, —S(=O)$_2$—O—, —N— and the like.

The aromatic hydrocarbon group for $R^{o41}$ may be monocyclic or polycyclic. Examples of an aromatic ring contained in the aromatic hydrocarbon group include the same as those listed for $R^{13}$ in the general formula (u13-1).

Specific examples of the aromatic hydrocarbon group for $R^{o41}$ include a group obtained by removing $n^{o31}$ hydrogen atoms from the aromatic hydrocarbon ring or the aromatic heterocyclic ring; a group obtained by removing $n^{o31}$ hydrogen atoms from an aromatic compound (for example, biphenyl, fluorene, and the like) containing two or more aromatic rings; a group obtained by removing $n^{o31}$ hydrogen atoms from a group in which one of hydrogen atoms of the aromatic hydrocarbon ring or the aromatic heterocyclic ring is substituted with an alkylene group; a group in which $n^{o31}$ hydrogen atoms of the aromatic hydrocarbon ring or the aromatic heterocyclic ring are substituted with alkylene groups; and the like. An allylene group to be bonded to the aromatic hydrocarbon ring or the aromatic heterocyclic ring preferably has 1 to 4 carbon atoms, more preferably 1 to 2 carbon atoms, particularly preferably 1 carbon atom.

The aromatic hydrocarbon group for $R^{o41}$ may or may not have a substituent. Examples of the substituent include a hydroxy group, a carbonyl group, an alkoxy group, a nitro group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms.

In the formula, the $n^{o31}$-valent hydrocarbon group for $R^{o41}$ is preferably an aromatic hydrocarbon group having 6 to 30 carbon atoms, a linear or branched saturated aliphatic hydrocarbon group having 1 to 10 carbon atoms, or the like.

Specific examples of $R^{o41}$ include groups respectively represented by the following general formulae (Ro41-1) to (Ro41-8).

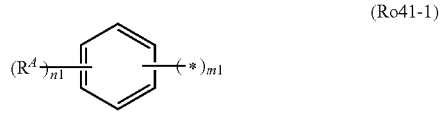

(Ro41-1)

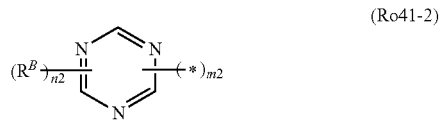

(Ro41-2)

(Ro41-3)

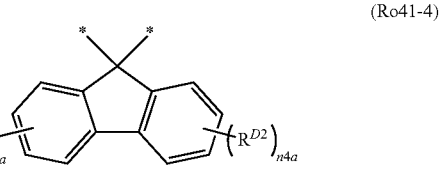

(Ro41-4)

-continued (Ro41-5)

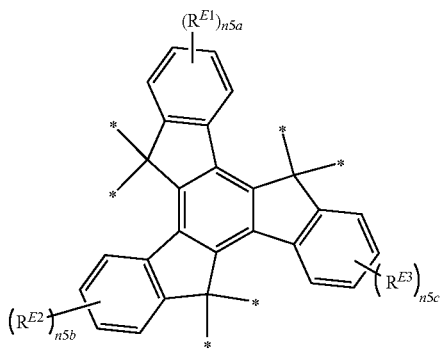

(Ro41-6)

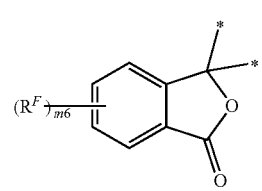

(Ro41-7)

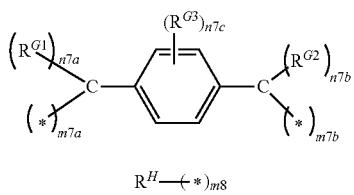

(Ro41-8)

$R^H$—$(*)_{m8}$

In the formulae (Ro41-1) to (Ro41-8), the mark "*" represents a bond to be bonded to a carbon atom of the aromatic hydrocarbon ring for $Ar^{o11}$ in the formula (o1-1-1a).

In the formula (Ro41-1), $R^A$ is a hydroxy group, a halogen atom, a nitro group, or a hydrocarbon group having 1 to 20 carbon atoms which may have a substituent. n1 is an integer of 0 to 4. In the case where n1 is 2 or more, a plurality of $R^A$s may be the same or different. m1 is an integer of 2 to 6, provided that n1+m1 is 6 or less. n1 is preferably 0 or 1, more preferably 0. m1 is preferably 2, 3, 4 or 6, more preferably 3.

In the formula (Ro41-2), $R^B$ is a hydroxy group, a halogen atom, a nitro group, or a hydrocarbon group having 1 to 20 carbon atoms which may have a substituent. n2 is 0 or 1. m2 is 2 or 3, provided that n2+m2 is 3 or less. n2 is preferably 0. m2 is preferably 3. n3 is preferably 2 or 3.

In the formula (Ro41-3), $R^C$ is a hydrogen atom, a hydroxy group, a halogen atom, a nitro group, or a hydrocarbon group having 1 to 20 carbon atoms which may have a substituent. n3 is an integer of 0 to 2. In the case where n3 is 2, a plurality of RCs may be the same or different. m3 is an integer of 2 to 4, provided that n3+m3 is 4. n3 is preferably 2 or 3.

In the formula (Ro41-4), $R^{D1}$ and $R^{D2}$ each independently represents a hydroxy group, a halogen atom, a nitro group, or a hydrocarbon group having 1 to 20 carbon atoms which may have a substituent. n4a and n4b each independently represents an integer of 0 to 4. In the case where n4a is 2 or more, a plurality of R's may be the same or different. In the case where n4b is 2 or more, a plurality of R's may be the same or different. n4a and n4b each are preferably 0 or 1, more preferably 0.

In the formula (Ro41-5), $R^{E1}$ to $R^{E3}$ each independently represents a hydroxy group, a halogen atom, a nitro group, or a hydrocarbon group having 1 to 20 carbon atoms which may have a substituent. n5a, n5b and n5c each independently represents an integer of 0 to 4. In the case where n5a is 2 or more, a plurality of $R^{E1}$s may be the same or different. In the case where n5b is 2 or more, a plurality of $R^{E2}$s may be the same or different. In the case where n5c is 2 or more, a plurality of $R^{E3}$s may be the same or different. n5a, n5b and n5c each are preferably 0 or 1, more preferably 0.

In the formula (Ro41-6), $R^F$ is a hydroxy group, a halogen atom, a nitro group, or a hydrocarbon group having 1 to 20 carbon atoms which may have a substituent. n6a is an integer of 0 to 4. In the case where n6a is 2 or more, a plurality of $R^F$s may be the same or different. n6a is preferably 0 or 1, more preferably 0.

In the formula (Ro41-7), $R^{G1}$ and $R^{G2}$ each independently represents a hydroxy group, a halogen atom, a nitro group, or a hydrocarbon group having 1 to 20 carbon atoms which may have a substituent. n7a and n7b each independently represents an integer of 0 to 2. In the case where n7a is 2 or more, two $R^{G1}$s may be the same or different. In the case where n7b is 2 or more, two $R^{G2}$s may be the same or different. $R^{G3}$ is a hydroxy group, a halogen atom, a nitro group, or a hydrocarbon group having 1 to 20 carbon atoms which may have a substituent. n7c is an integer of 0 to 4. In the case where n7c is 2 or more, a plurality of $R^{G3}$s may be the same or different. m7a and m7b each independently represents an integer of 1 to 3. n7a+m7a is 3. n7b+m7b is 3. n7c is preferably 0 or 1, more preferably 0.

In the formula (Ro41-8), $R^H$ is an m8-valent aliphatic hydrocarbon group having 2 to 20 carbon atoms. m8 is preferably an integer of 1 to 4, more preferably 3 or 4.

In the formulae (Ro41-1) to (Ro41-8), examples of the hydrocarbon group having 1 to 20 carbon atoms which may have a substituent for $R^A$ to $R^{G2}$ include the same as those listed for $R^{13}$ in the general formula (u13-1).

$R^{o41}$ is preferably any one of groups respectively represented by the formula (Ro41-1) to (Ro41-8), more preferably a group represented by the formula (Ro41-3) or (Ro41-8).

Preferred examples of the compound (O1-2) include a compound represented by the following general formula (o1-1-2a).

(o1-1-2a)

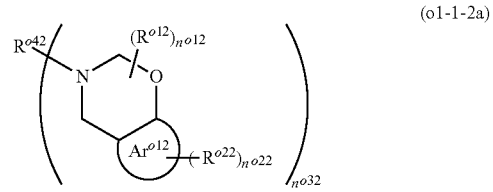

In the formula, $R^{o12}$, $Ar^{o12}$, $R^{o22}$, $n^{o12}$, $n^{o22}$ and $R^{o32}$ are defined the same as those in the general formula (o1-1-2). $n^{o32}$ represents an integer of 1 to 5. $R^{o42}$ represents an $n^{o32}$-valent hydrocarbon group which may have a substituent.

In the general formula (o1-1-2a), $n^{o32}$ is an integer of 1 to 5. $n^{o32}$ is preferably an integer of 2 to 5, more preferably an integer of 2 to 4, still more preferably 2 or 3.

In the general formula (o1-1-2a), $R^{o42}$ represents an $n^{o32}$-valent hydrocarbon group which may have a substituent.

The $n^{o32}$-valent hydrocarbon group which may have a substituent for $R^{o42}$ is preferably a hydrocarbon group having 1 to 30 carbon atoms which may have a substituent. Example of the $n^{o32}$-valent hydrocarbon group having 1 to 30 carbon atoms which may have a substituent include the same as those listed for $R^{o41}$ in the general formula (o1-1-1a).

Specific examples of $R^{o42}$ include groups respectively represented by the following general formulae (Ro42-1) to (Ro42-11).

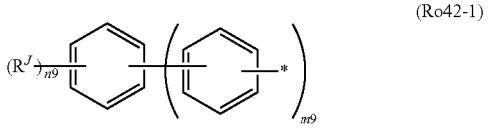
(Ro42-1)

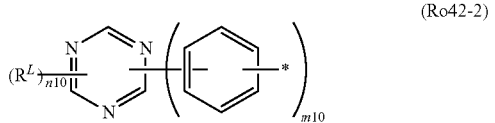
(Ro42-2)

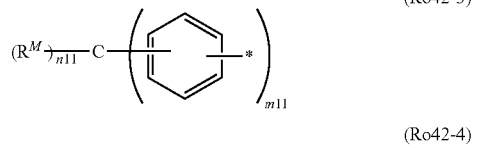
(Ro42-3)

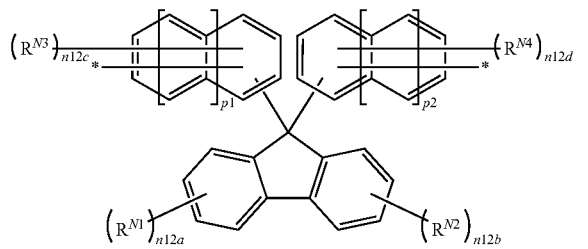
(Ro42-4)

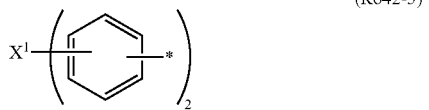
(Ro42-5)

N—(R$^P$—*)$_3$
(Ro42-6)

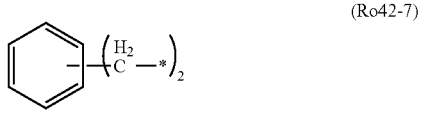
(Ro42-7)

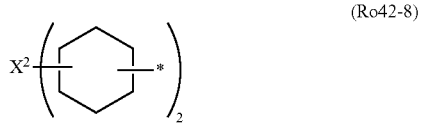
(Ro42-8)

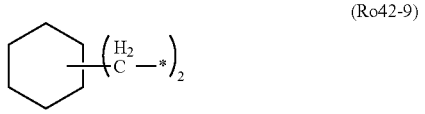
(Ro42-9)

$R^Q$—(*)$_2$
(Ro42-10)

$R^R$—(*)$_2$
(Ro42-11)

In the formulae (Ro42-1) to (Ro42-11), the mark "*" represents a bond to be bonded to a nitrogen atom in the general formula (o1-1-2a).

In the formula (Ro42-1), $R^J$ is a hydroxy group, a halogen atom, a nitro group, or a hydrocarbon group having 1 to 20 carbon atoms which may be a substituent. n9 is an integer of 0 to 4. In the case where n9 is 2 or more, a plurality of $R^J$s may be the same or different. m9 is an integer of 2 to 6, provided that n9+m9 is 6 or less.

In the formula (Ro42-2), $R^L$ is a hydroxy group, a halogen atom, a nitro group, or a hydrocarbon group having 1 to 20 carbon atoms which may have a substituent. n10 is 0 or 1. m10 is 2 or 3, provided that n10+m10 is 3 or less.

In the formula (Ro42-3), $R^M$ is a hydrogen atom, a hydroxy group, a halogen atom, a nitro group, or a hydrocarbon group having 1 to 20 carbon atoms which may have a substituent. n11 is an integer of 0 to 2. In the case where n11 is 2, a plurality of $R^M$s may be the same or different. m11 is an integer of 2 to 4, provided that n11+m11 is 4.

In the formula (Ro42-4), $R^{N1}$ and $R^{N2}$ each independently represents a hydroxy group, a halogen atom, a nitro group, or a hydrocarbon group having 1 to 20 carbon atoms which may have a substituent. n12a and n12b each independently represents an integer of 0 to 4. In the case where n12a is 2 or more, a plurality of $R^{N1}$'s may be the same or different. In the case where n12b is 2 or more, a plurality of $R^{N2}$'s may be the same or different. $p^1$ and $p^2$ each independently represents an integer of 0 to 4, preferably 0 to 2, more preferably 0 or 1, still more preferably 0. $R^{N3}$ and $R^{N4}$ each independently represents a hydrocarbon group having 1 to 20 carbon atoms which may have a substituent. n12c and n12d each independently represents an integer of 0 to 4. In the case where n12c is 2 or more, a plurality of $R^{N3}$'s may be the same or different. In the case where n12d is 2 or more, a plurality of $R^{N4}$'s may be the same or different.

In the formula (Ro42-5), $X^1$ is —O—, —S—, —SO$_2$—, or an alkanediyl group having 1 to 10 carbon atoms.

In the formula (Ro42-6), $R^P$'s each independently represents an alkanediyl group having 1 to 5 carbon atoms.

In the formula (Ro42-8), $X_2$ is —O—, —S—, —SO$_2$—, or an alkanediyl group having 1 to 10 carbon atoms.

In the formula (Ro42-10), $R^Q$ is a divalent aliphatic hydrocarbon group or a divalent aliphatic heterocyclic group.

In the formula (Ro42-11), $R^R$ is an arenediyl group.

In the formulae (Ro42-1) to (Ro42-11), examples of the hydrocarbon group having 1 to 20 carbon atoms which may have a substituent for $R^J$ to $R^{N4}$ include the same as those listed for $R^{13}$ in the general formula (u13-1).

$R^{o42}$ is preferably any one of groups respectively represented by the formulae (Ro42-1) to (Ro42-11), more preferably any one of groups respectively represented by the formulae (Ro42-1) to (Ro42-5).

Specific examples of the compound (O1) are shown below; however, the compound (O1) is not limited thereto.

Further, among the compounds exemplified below, a compound (O1-4) is a compound corresponding to a "Compound Containing Fluorene Ring" described later.

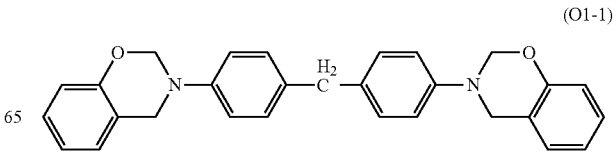
(O1-1)

(O1-2)

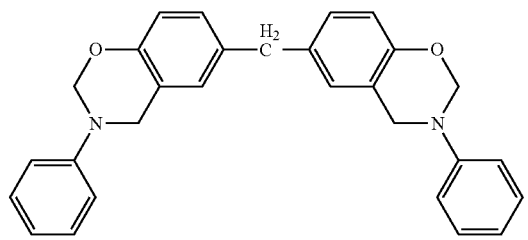

(f1-1)

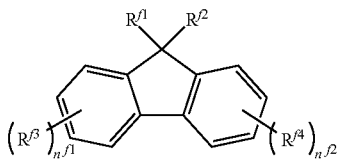

In the formula, $R^{f1}$ and $R^{f2}$ each independently is a hydrocarbon group having 1 to 20 carbon atoms which may have a substituent. $R^{f3}$ and $R^{f4}$ each independently represents a hydrocarbon group having 1 to 20 carbon atoms which may have a substituent, a halogen atom, a nitro group, an amino group, or a sulfo group. $n^{f1}$ and $n^{f2}$ each independently represents an integer of 0 to 4.

In the general formula (f1-1), $R^{f1}$ and $R^{f2}$ each independently is a hydrocarbon group having 1 to 20 carbon atoms which may have a substituent.

Examples of the hydrocarbon group having 1 to 20 carbon atoms for $R^{f1}$ and $R^{f2}$ include the same as those listed as the hydrocarbon group having 1 to 20 carbon atoms for $R^{13}$ in the general formula (u13-1). In particular, examples thereof include a branched aliphatic hydrocarbon group having 1 to 20 carbon atoms, an aliphatic hydrocarbon group having 3 to 20 carbon atoms and containing a ring in a structure, and an aromatic hydrocarbon group having 5 to 20 carbon atoms.

Among these, the hydrocarbon group having 1 to 20 carbon atoms for $R^{f1}$ and $R^{f2}$ is preferably an aromatic hydrocarbon group having 5 to 20 carbon atoms. Preferred examples thereof include a group (an arylene group or a heteroarylene group) obtained by removing one hydrogen atom from an aromatic hydrocarbon ring or an aromatic heterocyclic ring. Among these, a phenyl group or a naphthyl group is preferred.

The hydrocarbon group having 1 to 20 carbon atoms for $R^{f1}$ and $R^{f2}$ may or may not have a substituent.

(O1-3)

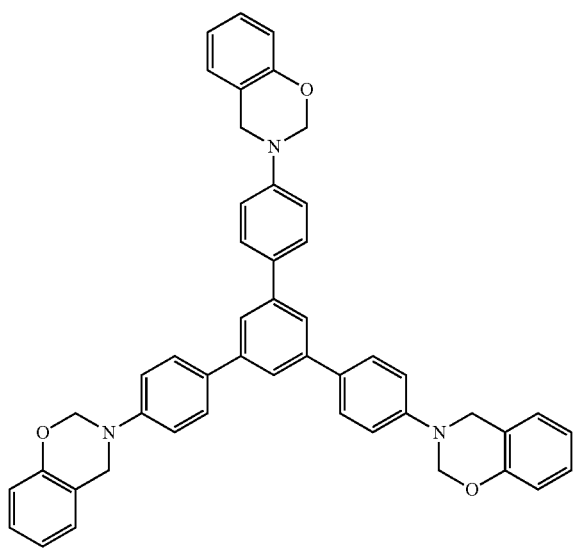

(O1-4)

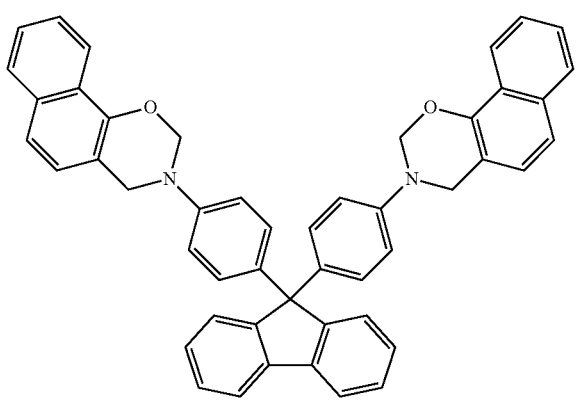

In the case where $R^{f1}$ and $R^{f2}$ each represent a linear or branched aliphatic hydrocarbon group having 1 to 20 carbon atoms, examples of the substituent include a hydroxy group, a carboxy group, a halogen atom, an amino group, a nitro group, a sulfo group, an alkoxy group, an epoxy group and the like.

In the case where $R^{f1}$ and $R^{f2}$ each represent an aliphatic hydrocarbon group having 3 to 20 carbon atoms, examples of the substituent include a hydroxy group, a carboxy group, a halogen atom, an amino group, a nitro group, a sulfo group, an alkoxy group, an epoxy group, an alkyl group, a halogenated alkyl group, a glycidyl group, a glycidoxy group and the like.

In the case where $R^{f1}$ and $R^{f2}$ each represent an aromatic hydrocarbon group having 5 to 20 carbon atoms, examples of the substituent include a hydroxy group, a carboxy group, a halogen atom, an amino group, a nitro group, a sulfo group, an alkoxy group, an epoxy group, an alkyl group, a halogenated alkyl group, a glycidyl group, a glycidoxy group and the like.

The alkyl group, the halogenated alkyl group and the alkoxy group as the substituent respectively have preferably 1 to 5 carbon atoms, more preferably 1 to 3 carbon atoms.

The hydrocarbon group having 1 to 20 carbon atoms for $R^{f1}$ and $R^{f2}$ preferably has at least one polar group. Examples of the polar group include a hydroxy group, a carboxy group, an amino group, a sulfo group, an alkoxy group (having

[Compound Containing Fluorene Ring]

It is preferable that a compound containing a fluorene ring contain at least one polar group in addition to a fluorene ring. Examples of the polar group include a hydroxy group, a carboxy group, an amino group, a sulfo group, an alkoxy group, an epoxy group and the like. Among these, the polar group is preferably a hydroxy group or an epoxy group.

Examples of the compound containing a fluorene ring include a compound (F1) containing a structure represented by the following general formula (f1-1).

preferably 1 to 5 carbon atoms), an epoxy group and the like. Among these, the polar group is preferably a hydroxy group or an epoxy group.

In the general formula (f1-1), $R^{f3}$ and $R^{f4}$ each independently represents a hydrocarbon group having 1 to 20 carbon atoms which may have a substituent, a halogen atom, a nitro group, an amino group, or a sulfo group. Examples of the hydrocarbon group having 1 to 20 carbon atoms which may have a substituent for $R^{f3}$ and $R^{f4}$ include the same as those listed as the hydrocarbon group having 1 to 20 carbon atoms for $R^{13}$ in the general formula (u13-1).

In the general formula (f1-1), $n^{f1}$ and $n^{f2}$ each independently represents an integer of 0 to 4.

$n^{f1}$ and $n^{f2}$ each are preferably an integer of 0 to 3, more preferably an integer of 0 to 2, still more preferably 0 or 1, particularly preferably 0.

Preferred examples of the compound (F1) include a compound represented by the following general formula (f1-1-1).

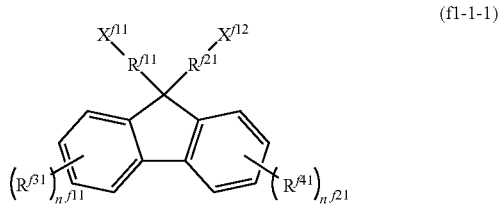

(f1-1-1)

In the formula, $R^{f11}$ and $R^{f21}$ each independently represents an aromatic hydrocarbon group having 6 to 20 carbon atoms which may have a substituent. $R^{f31}$ and $R^{f41}$ each independently represents a hydrocarbon group having 1 to 20 carbon atoms which may have a substituent, a halogen atom, a nitro group, an amino group, or a sulfo group. $X^{f11}$ and $X^{f21}$ each independently represents a polar group. $n^{f11}$ and $n^{f21}$ each independently represents an integer of 0 to 4.

In the general formula (f1-1-1), $R^{f11}$ and $R^{f21}$ each independently represents an aromatic hydrocarbon group having 6 to 20 carbon atoms which may have a substituent. Examples of the aromatic hydrocarbon group having 6 to 20 carbon atoms for $R^{f11}$ and $R^{f21}$ include the same as those listed as the aromatic hydrocarbon group for $R^{f1}$ and $R^{f2}$ in the general formula (f1-1). Among these, the aromatic hydrocarbon group for $R^{f11}$ and $R^{f21}$ is preferably a phenyl group or a naphthyl group.

The aromatic hydrocarbon group having 6 to 20 carbon atoms for $R^{f11}$ and $R^{f21}$ may or may not have a substituent. Examples of the substituent include a hydroxy group, a carboxy group, a halogen atom, an amino group, a nitro group, a sulfo group, an alkoxy group, an epoxy group, an alkyl group, a halogenated alkyl group, a glycidyl group, a glycidoxy group and the like. Among these, the substituent is preferably an alkyl group, more preferably an alkyl group having 1 to 5 carbon atoms, still more preferably an alkyl group having 1 to 3 carbon atoms.

In the general formula (f1-1-1), $R^{f31}$ and $R^{f41}$ each independently represents a hydrocarbon group having 1 to 20 carbon atoms which may have a substituent, a halogen atom, a nitro group, an amino group, or a sulfo group. Examples of the hydrocarbon group having 1 to 20 carbon atoms which may have a substituent for $R^{f31}$ and $R^{f41}$ include the same as those listed as the hydrocarbon group having 1 to 20 carbon atoms for $R^{13}$ in the general formula (u13-1).

In the general formula (f1-1-1), $n^{f11}$ and $n^{f21}$ each independently represents an integer of 0 to 4. $n^{f11}$ and $n^{f21}$ each are preferably an integer of 0 to 3, more preferably an integer of 0 to 2, still more preferably 0 or 1, particularly preferably 0.

In the general formula (f1-1-1), $X^{f11}$ and $X^{f21}$ each independently represents a polar group. Examples of the polar group for $X^{f11}$ and $X^{f21}$ include a hydroxy group, a carboxy group, an amino group, a sulfo group, an alkoxy group (having preferably 1 to 5 carbon atoms), an epoxy group, a glycidyl group, a glycidoxy group and the like. Among these, the polar group is preferably a hydroxy group, an epoxy group, a glycidyl group or a glycidoxy group.

Specific examples of the compound (F1) are shown below; however, the compound (F1) is not limited thereto.

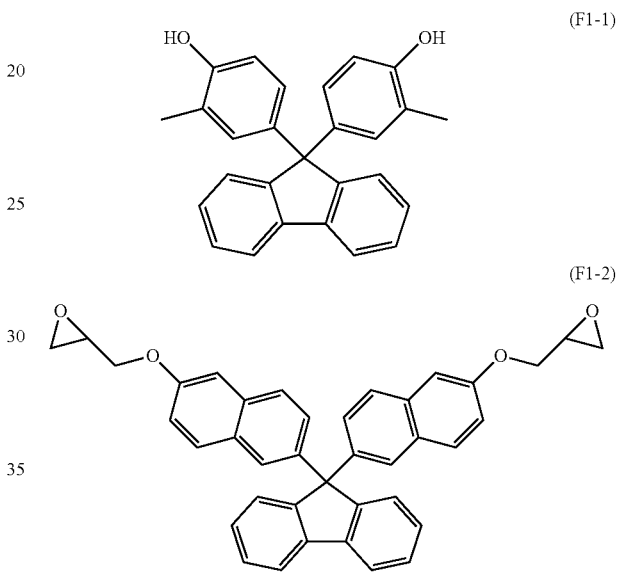

The compound (OF) may be used alone or in combination. For example, the compound (OF) may be the compound (O1), the compound (F1), or a compound corresponding to both the compound (O1) and the compound (F1). Alternatively, the compound (O1) and the compound (F1) may be used in combination. Further, two or more types of the compounds (O1) may be used in combination, or two or more types of the compounds (F1) may be used in combination.

The content of the compound (OF) in the hard mask-forming composition is preferably 10 to 100 parts by mass, more preferably 20 to 100 parts by mass, still more preferably 30 to 100 parts by mass, based on 100 parts by mass of the resin (P) in the hard mask-forming composition. In the case where the content of the compound (OF) is at least the lower limit value of the preferable range stated above, embeddability of the hard mask-forming composition is improved. Additionally, in the case where the content of the compound (OF) is equal to or less than the upper limit value of the preferable range stated above, etching resistance is improved.

In the case where the compound (OF) is the compound (O1), the content of the compound (O1) in the hard mask-forming composition is preferably 10 to 100 parts by mass, more preferably 20 to 80 parts by mass, still more preferably 30 to 60 parts by mass, based on 100 parts by mass of the resin (P) in the hard mask-forming composition.

In the case where the compound (OF) is the compound (F1), the content of the compound (F1) in the hard mask-forming composition is preferably 10 to 100 parts by mass, more preferably 20 to 100 parts by mass, still more preferably 30 to 100 parts by mass, based on 100 parts by mass of the resin (P) in the hard mask-forming composition.

<Optional Components>

The hard mask-forming composition of the present embodiment may contain other components in addition to the resin (P) and the compound (OF). Examples of the other components include a crosslinking agent, a crosslinking acceleration catalyst, a photoacid generator, an absorbent, a rheology modifier, an adhesion aider, a surfactant, a solvent and the like.

Examples of the crosslinking agent include an amino-based crosslinking agent such as glycoluril having a methylol group or an alkoxymethyl group; a melamine-based crosslinking agent; and the like. A specific example is Nikalac (registered trademark) series, manufactured by Sanwa Chemical Co., Ltd., such as Nikalac MX 270. A blending amount of the crosslinking agent is preferably 1 to 50 parts by mass, more preferably 1 to 40 parts by mass, based on 100 parts by mass of all resin components in the hard mask-forming composition. The crosslinking agent may be used alone or in combination.

Examples of the crosslinking acceleration catalyst include an acidic compound such as p-toluenesulfonic acid, trifluoromethanesulfonic acid, pyridinium p-toluenesulfonic acid, salicyclic acid, sulfosalicyclic acid, citric acid, benzoic acid, hydroxybenzoic acid, naphthalenecarboxylic acid or the like; a thermal acid generator such as 2,4,4,6-tetrabromocyclohexadienone, benzoin tosylate, 2-nitrobenzyl tosylate, other organic sulfonic acid alkyl esters or the like; and the like. A blending amount of the crosslinking acceleration catalyst is preferably 0.0001 to 20 parts by mass, more preferably 0.0005 to 10 parts by mass, still more preferably 0.01 to 3 parts by mass, based on 100 parts by mass of all resin components in the hard mask-forming composition. The crosslinking acceleration catalyst may be used alone or in combination.

Examples of the photoacid generator include onium salt photoacid generators such as bis (4-t-butylphenyl) iodonium trifluoromethanesulfonate, triphenylsulfonium trifluoromethanesulfonate or the like; halogen-containing compound photoacid generators such as phenyl-bis (trichloromethyl)-s-triazine or the like; sulfonic acid photoacid generators such as benzoin tosylate, N-hydroxysuccinimide trifluoromethanesulfonate or the like; and the like. A blending amount of the photoacid generator is preferably 0.2 to 10 parts by mass, more preferably 0.4 to 5 parts by mass, based on 100 parts by mass of all resin components in the hard mask-forming composition. The photoacid generator may be used alone or in combination.

Examples of the absorbent include commercially available absorbents listed in "Technology and Market for Industrial Dyes" (published by CMC) and "Dyes Handbook" (edited by the Society of Synthetic Organic Chemistry), for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; C. I. Pigment Brown 2; and the like. A blending amount of the absorbent is preferably 10 parts by mass or less, more preferably 5 parts by mass or less, based on 100 parts by mass of all resin components in the hard mask-forming composition. The absorbent may be used alone or in combination.

Examples of the rheology modifier include phthalic acid derivatives such as dimethyl phthalate, diethyl phthalate, diisobutyl phthalate, dihexyl phthalate, butyl isodecyl phthalate or the like; adipic acid derivatives such as dinormal butyl adipate, diisobutyl adipate, diisooctyl adipate, octyl decyl adipate or the like; Maleic acid derivatives such as dinormal butyl malate, diethyl malate, dinonyl malate or the like; Oleic acid derivatives such as methyl oleate, butyl oleate, tetrahydrofurfuryl oleate, or the like; and stearic acid derivatives such as normal butyl stearate, glyceryl stearate or the like. A blending amount of the rheology modifier is preferably less than 30 parts by mass, based on 100 parts by mass of all resin components in the hard mask-forming composition. The rheology modifier may be used alone or in combination.

Examples of the adhesion aider include chlorosilanes such as trimethylchlorosilane, dimethylvinylchlorosilane, methyldiphenylchlorosilane, chloromethyldimethylchlorosilane or the like; alkoxysilanes such as trimethylmethoxysilane, dimethyldiethoxysilane, methyldimethoxysilane, dimethylvinylethoxysilane, diphenyldimethoxysilane, phenyltriethoxysilane or the like; silazanes such as hexamethyldisilazane, N, N'-bis (trimethylsilyl) urea, dimethyltrimethylsilylamine, trimethylsilylimidazole or the like; Silanes such as vinyltrichlorosilane, γ-chloropropyltrimethoxysilane, γ-aminopropyltriethoxysilane, γ-glycidoxypropyltrimethoxysilane or the like; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine or the like; urea such as 1,1-dimethylurea, 1,3-dimethylurea or the like; and thiourea compounds. A blending amount of the adhesion aider is preferably less than 5 parts by mass, more preferably less than 2 parts by mass, based on 100 parts by mass of all resin components in the hard mask-forming composition. The adhesion aider may be used alone or in combination.

Examples of the surfactant include a nonionic surfactant encompassing: olyoxyethylene alkyl ethers such as polyoxyethylene lauryl ether, polyoxyethylene stearyl ether, polyoxyethylene cetyl ether, polyoxyethylene oleyl ether or the like; polyoxyethylene alkyl allyl ethers such as polyoxyethylene octyl phenol ether, polyoxyethylene nonyl phenol ether or the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate or the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate or the like; and the like. Other examples of the surfactant include a fluorinated surfactant such as F-top (registered trademark) EF 301, EF 303 and EF 352 (collectively manufactured by Mitsubishi Materials Electronic Chemicals Co., Ltd. (formerly Tochem Products), product names), Megafac (registered trademark) F171, F173, R-30 and R-40 (collectively manufactured by DIC Corporation (formerly Dai Nippon Ink Co., Ltd.), product names), Fluorad FC430 and FC431 (collectively manufactured by Sumitomo 3M Co., Ltd., product names), Asahi-Guard (registered trademark) AG710, Surflon (registered trademark) S-382, SC101, SC102, SC103, SC104, SC105 and Sc106 (collectively manufactured by Asahi Glass Co., Ltd., product names), or the like; Organosiloxane Polymer KP 341 (manufactured by Shin-Etsu Chemical Co., Ltd., product name); and the like. A blending amount of the surfactant is preferably 2.0 parts by mass or less, more preferably 1.0 parts by mass or less, based on 100 parts by mass of all resin components in the hard mask-forming composition. The surfactant may be used alone or in combination.

A solvent is used to dissolve the resin (P), the compound (OF) and the optional components. Examples of the solvent include lactones such as γ-butyrolactone or the like; ketones such as acetone, methyl ethyl ketone, cyclohexanone, methyl-n-pentyl ketone, methyl isopentyl ketone, 2-heptanone or the like; polyhydric alcohols such as ethylene glycol, diethylene glycol, propylene glycol, dipropylene glycol or the like; derivatives of polyhydric alcohols which include compounds having an ester bond such as ethylene glycol monoacetate, diethylene glycol monoacetate, propylene glycol monoacetate, or dipropylene glycol monoacetate, compounds having an ether bond such as monoalkyl ethers (including monomethyl ether, monoethyl ether, monopropyl ether and monobutyl ether) or monophenyl ether of the polyhydric alcohol or the compound having the ester bond, and the like (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate or the like; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, mesitylene or the like; dimethyl sulfoxide (DMSO); and the like. Among these, it is preferred to employ PGME, PGMEA, ethyl lactate, butyl lactate, γ-butyrolactone, cyclohexanone, mixed solvents of those and the like, from the viewpoint of further improving the leveling property.

The solvent may be used alone or be a mixed solvent of two or more solvents. Examples of the mixed solvent include a mixed solvent of PGME and PGMEA.

The amount of the solvent used is not particularly limited, and is appropriately set to a concentration applicable to a substrate or the like, depending on the thickness of a coating film thickness. For example, the solvent may be blended so that the resin component concentration in the hard mask-forming composition falls within a range of 1 to 50% by mass, preferably a range of 15 to 35% by mass.

The hard mask-forming composition according to the embodiment is capable of forming a hard mask layer having good etching resistance and improved embeddability, since it uses the resin (P) containing an aromatic ring and a polar group and the compound (OF) containing at least one structure selected from the group consisting of an oxazine ring fused to an aromatic ring and a fluorene ring in combination. It is presumed that heating causes interaction, such as dehydration condensation, between the polar group contained in the resin (P) and the compound (OF) upon forming the hard mask layer, thus etching resistance and embeddability are improved.

A planarized hard mask layer with high mask performance can be formed by using the hard mask-forming composition according to the embodiment even when a substrate has steps.

<Method for Manufacturing Electronic Component>

First Embodiment

The method for manufacturing an electronic component according to the second aspect of the present invention includes steps of:

forming a hard mask layer (m1) on a support using the hard mask-forming composition according to the first aspect (hereinafter referred to as "step (i)");

forming a hard mask layer (m2) made of an inorganic material on the hard mask layer (m1) (hereinafter referred to as "step (ii)");

forming a resist film on the hard mask layer (m2) (hereinafter referred to as "step (iii)");

forming a resist pattern on the hard mask layer (m2) by exposing and developing the resist film (hereinafter referred to as "step (iv)");

etching the hard mask layer (m2) using the resist pattern as a mask to form an inorganic pattern (hereinafter referred to as "step (v)");

etching the hard mask layer (m1) using the inorganic pattern as a mask to form a resin pattern (hereinafter referred to as "step (vi)"); and processing the support with the resin pattern as a mask (hereinafter referred to as "step (vii)").

Hereinafter, a specific example of the method for manufacturing an electronic component according to an embodiment will be described with reference to FIGS. 1 to 8. However, the manufacturing method according to the embodiment is not limited thereto.

FIG. 1 shows a support 10 formed by a substrate 11 and a processing layer 12.

Figure 2:
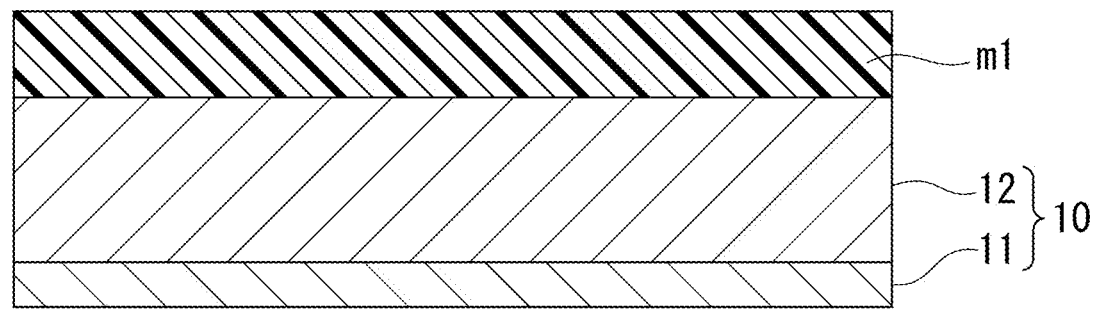
FIG. 2 is a view illustrating an exemplified process of forming a hard mask layer (m1) in the method for manufacturing an electronic component according to the embodiment of the present invention.

First, the hard mask layer (m1) is formed on the support 10 using the hard mask-forming composition according to the first aspect (FIG. 2; step (i)).

Figure 3:
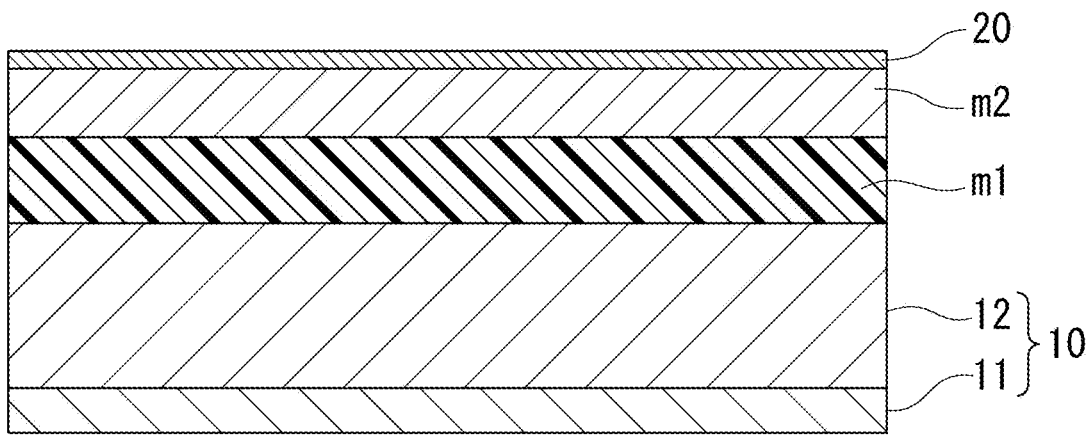
FIG. 3 is a view illustrating an exemplified process of forming a hard mask layer (m2) in the method for manufacturing an electronic component according to the embodiment of the present invention.

The hard mask layer (m2) made of the inorganic material is formed on the hard mask layer (m1) (FIG. 3; step (ii)). An antireflective film (BARC) 20 is formed on the hard mask layer (m2) if needed.

Figure 4:
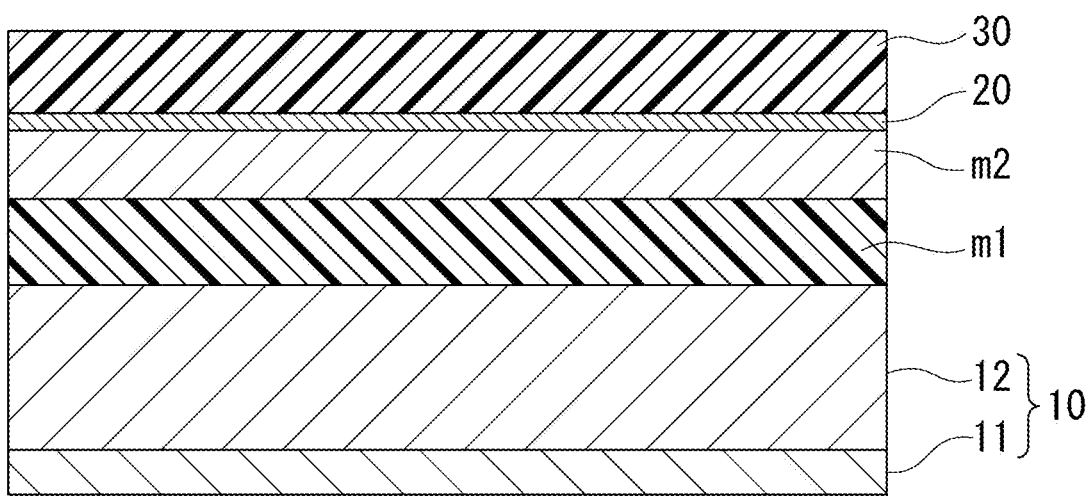
FIG. 4 is a view illustrating an exemplified process of forming a resist film in the method for manufacturing an electronic component according to the embodiment of the present invention.

A resist film 30 is formed on the hard mask layer (m2) using a resist composition (FIG. 4; step (iii)).

Figure 5:
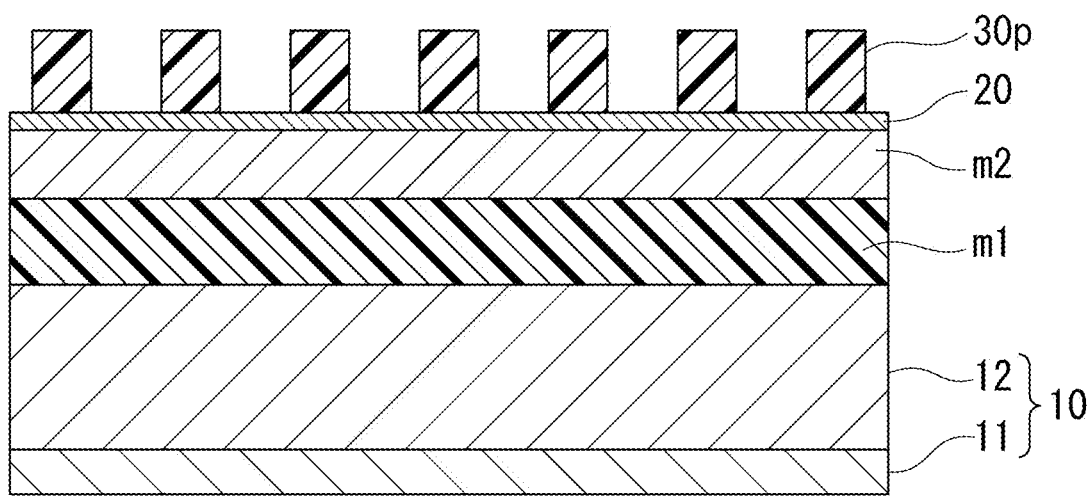
FIG. 5 is a view illustrating an exemplified process of forming a resist pattern in the method for manufacturing an electronic component according to the embodiment of the present invention.

A resist pattern 30p is formed on the hard mask layer (m2) by exposing and developing the resist film (FIG. 5; step (iv)).

Figure 6:
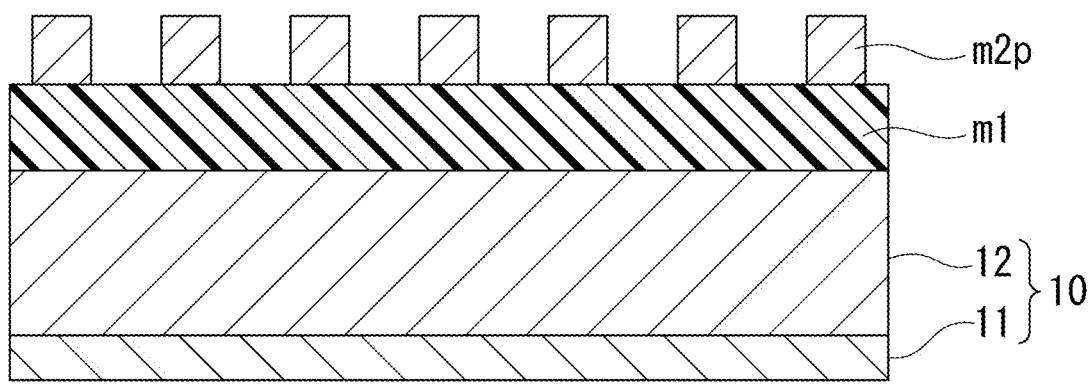
FIG. 6 is a view illustrating an exemplified process of forming an inorganic pattern in the method for manufacturing an electronic component according to the embodiment of the present invention.

The hard mask layer (m2) is etched with the resist pattern 30p as a mask to form an inorganic pattern (m2p) (FIG. 6; step (v)).

Figure 7:
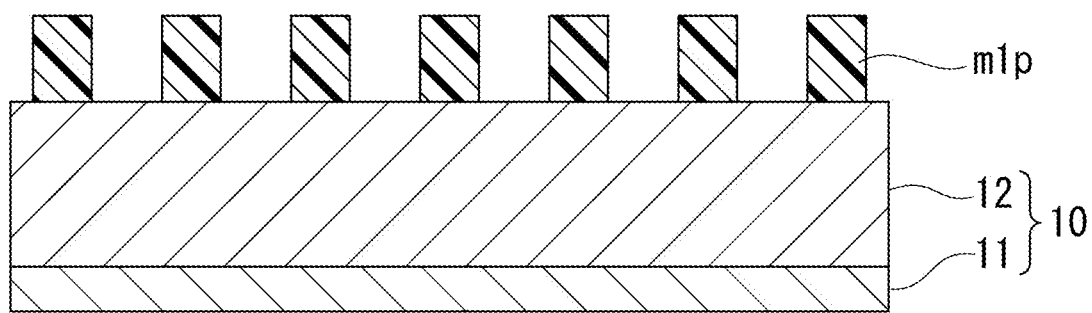
FIG. 7 is a view illustrating an exemplified process of forming a resin pattern in the method for manufacturing an electronic component according to the embodiment of the present invention.

The hard mask layer (m1) is etched with the inorganic pattern (m2p) as a mask to form a resin pattern (m1p) (FIG. 7; step (vi)).

Figure 8:
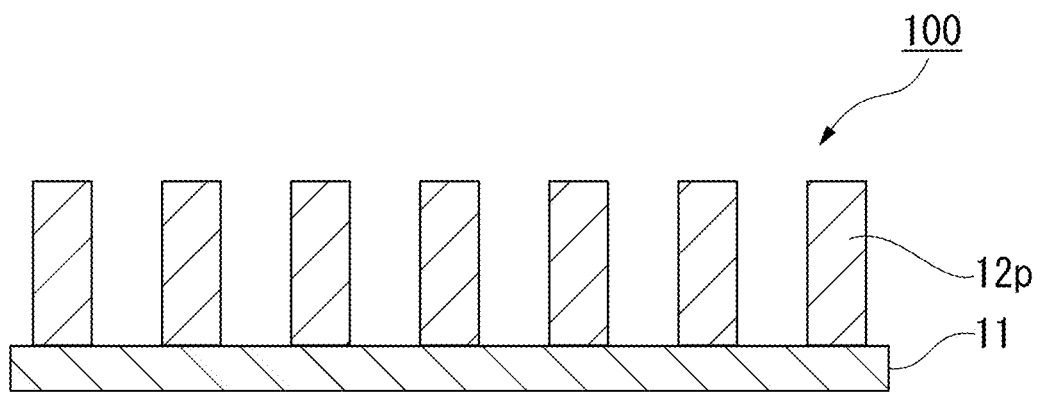
FIG. 8 is a view illustrating an exemplified process of processing a support in the method for manufacturing an electronic component according to the embodiment of the present invention.

The support 10 is processed with the resin pattern (m1p) as a mask to form a pattern 12p (FIG. 8; step (vii)).

Thus, the electronic component 100 provided with the pattern 12p on the substrate 11 can be fabricated.

[Step (i)]

Step (i) is a step of forming the hard mask layer (m1) using the hard mask-forming composition according to the first aspect on the support 10.

The support 10 is not particularly limited and a known support can be used. Examples thereof include an electronic component substrate, a substrate on which a predetermined wiring pattern is formed, and the like. In particular, specific examples of the support encompasses silicon wafers, metal substrates made of copper, chromium, iron, and aluminum, glass substrates, and the like. The wiring pattern can be formed with a material such as copper, aluminum, nickel, gold or the like.

Additionally, the support 10 may be a support in which the processing layer 12 is formed on the substrate 11. Examples of the processing layer 12 include various low-k films such as films of Si, $SiO_2$, SiON, SiN, p-Si, α-Si, W, W—Si, Al, Cu and Al—Si, and stopper films thereof. The processing layer 12 usually has a thickness of 50 to 10,000 nm. In the case of performing deep processing, the thickness of the processing layer 12 may fall within a range of 1,000 to 10,000 nm. In the case where the processing layer 12 is formed, the processing layer 12 is typically made of a material different from that of the substrate 11.

The hard mask layer (m1) is formed using the hard mask-forming composition according to the first aspect. In particular, the hard mask-forming composition according to the first aspect is applied onto the support 10 by spin coating or the like. The hard mask layer (m1) is formed by baking and curing the layer coated on the support 10. The layer is baked at a temperature falling within a range of 100° C. to 500° C., preferably a range of 200° C. to 450° C., more preferably a range of 300° C. to 400° C. The baking temperature is adjusted to be equal or less than the upper limit value of the range stated above, thus it is possible to suppress decrease in etching resistance due to the oxidation reaction of the resin. The baking temperature is adjusted to be at least the lower limit value of the range stated above, thus it is possible to suppress deterioration due to high temperature upon film formation in the process (ii), described below, can be suppressed. The baking time falls usually within a range of 10 to 600 seconds, preferably a range of 30 to 300 seconds, more preferably a range of 50 to 200 seconds.

The thickness of the hard mask layer (m1) is not particularly limited, and can be appropriately set according to the thickness of the processing layer 12. The thickness of the hard mask layer (m1) may fall within a range of 30 to 20,000 nm. In the case of performing deep processing, the thickness of the hard mask layer (m1) is preferably 1,000 nm or more. In this case, the thickness of the hard mask layer (m1) falls within preferably a range of 1,000 to 20,000 nm, more preferably a range of 1,000 to 15,000 nm.

[Step (ii)]

Step (ii) is a step of forming the hard mask layer (m2) made of the inorganic material on the hard mask layer (m1).

The inorganic material for forming the hard mask layer (m2) is not particularly limited, and known materials can be used. Examples of the inorganic material include a silicon oxide film ($SiO_2$ film), a silicon nitride film ($Si_3N_4$ film), a silicon oxynitride film (SiON film), and the like. Among these, a SiON film having a high effect as an antireflective film is preferable. The hard mask layer (m2) can be formed by the CVD or ALD method.

The thickness of the hard mask layer (m2) is, for example, about 5 to 200 nm, preferably about 10 to 100 nm.

In the case where the CVD or ALD method is used to form the hard mask layer (m2), a temperature becomes high (about 400° C.), and thus the hard mask layer (m1) is required to have high temperature resistance. The hard mask-forming composition according to the first aspect is excellent in heat resistance, and does not easily cause shrinkage even when exposed to the high temperature of about 400° C. Therefore, it can be suitably used in combination with the inorganic hard mask layer formed by the CVD or ALD method.

After forming the hard mask layer (m2), if needed, the antireflective film (BARC) 20 may be formed on the hard mask layer (m2). The BARC 20 may be an organic BARC or inorganic BARC. The BARC can be formed using methods already known in the art.

[Step (iii)]

Step (iii) is a step of forming the resist film 30 on the hard mask layer (m2) using the resist composition.

The resist composition is not particularly limited, and those proposed as a resist material suitable for a method using an exposure step can be generally used. The resist composition may be positive or negative. Examples of the resist composition include those containing a base component of which solubility in a developer changes due to action of the acid, and an acid generator component that generates the acid upon exposure.

The formation of the resist film 30 is not particularly limited, and a method generally used for forming the resist film 30 may be used. For example, the resist composition is applied by a spinner on the hard mask layer (m2) (in the case where the BARC 20 is formed, it is applied on the BARC 20 formed on the hard mask layer (m2)), and baked (post-apply baking (PAB)), for example, at a temperature of 80 to 150° C. for 40 to 120 seconds, preferably 60 to 90 seconds, thereby forming the resist film 30.

A thickness of the resist film 30 is not particularly limited, but it is generally about 30 to 500 nm.

[Step (iv)]

Step (iv) is a step of forming the resist pattern 30$p$ on the hard mask layer (m2) by exposing and developing the resist film 30.

The resist film 30 can be exposed using an exposure apparatus such as an ArF exposure apparatus, a KrF exposure apparatus, an electron beam drawing apparatus, an EUV exposure apparatus or the like. A wavelength used for exposure is not particularly limited. Exposure can be performed using ArF excimer laser, KrF excimer laser, F2 excimer laser, EUV (extreme ultraviolet), VUV (vacuum ultraviolet), EB (electron beam), radiation such as X-ray or soft X-ray, or the like. The resist film 30 may be exposed by normal exposure (dry exposure) performed in an inert gas such as air or nitrogen, or liquid immersion lithography.

For example, the resist film 30 is selectively exposed by exposure through a photomask (mask pattern) on which a predetermined pattern is formed, or by drawing with direct irradiation of the electron beam without a photomask. Subsequently, the resist film 30 is baked (post-exposure baking (PEB)), for example, at a temperature of 80 to 150° C. for 40 to 120 seconds, preferably 60 to 90 seconds.

Next, the resist film 30 is developed. A developer used for the development can be appropriately selected from commonly used developers according to a type of resist composition and a development method. For example, in the case of employing an alkali development process, an alkaline developer is used. In the case of employing a solvent development process, a developer (organic developer) containing an organic solvent is used.

Examples of the alkali developer used for development in the alkali development process include an aqueous solution of 0.1 to 10% by mass of tetramethylammonium hydroxide (TMAH).

Examples of the organic solvent contained in the organic developer used for development in the solvent development process include polar solvents such as a ketone solvent, an ester solvent, an alcohol solvent, a nitrile solvent, an amide solvent, an ether solvent or the like; a hydrocarbon solvent; and the like.

The development process can be carried out by a known development method, such as a method of immersing the support in the developer for a fixed time (dipping); a method of raising the developer on a surface of the support by surface tension and standing still for a fixed time (paddling); a method of spraying the developer on the surface of the support (spraying); a method of continuously applying the developer while scanning the developer coating nozzle at constant speed on the support rotating at constant speed (dynamic dispensing); or the like.

After the development process, the developed film is preferably rinsed. In the case of the alkali development process, the developed film is preferably rinsed using pure water, and in the case of the solvent development process, the developed film is preferably rinsed using a rinse solution containing an organic solvent.

Meanwhile, in the case of the solvent development process, after the development or rinsing, the developer or rinse solution adhering on the pattern may be removed with a supercritical fluid.

After the development or rinsing, the film is dried. The film may be baked (post baking) after the development if needed.

Therefore, the resist pattern 30p can be formed on the hard mask layer (m2).

[Step (v)]

Step (v) is a step of etching the hard mask layer (m2) with the resist pattern 30p as a mask to form the inorganic pattern (m2p).

A method of etching the hard mask layer (m2) is not particularly limited, and for example, common dry etching can be used. Examples of the etching method include chemical etching such as down flow etching, chemical dry etching or the like; physical etching such as sputter etching, ion beam etching or the like; and chemical-physical etching such as RIE (reactive-ion etching) or the like.

For example, in parallel plate RIE, a multilayer laminate is placed in a chamber of an RIE apparatus, and necessary etching gas is introduced. When a high frequency voltage is applied to a holder of the multilayer laminate placed in parallel with an upper electrode in the chamber, the etching gas is plasmified. Etching species including charged particles such as positive and negative ions or electrons, and neutral active species are present in the plasma. When these etching species are adsorbed to a lower resist layer, a chemical reaction occurs. Reaction products leave a surface and are exhausted to the outside, thereby performing etching.

Examples of the etching gas used for etching the hard mask layer (m2) include halogen-based gas. Examples of the halogen-based gas include hydrocarbon gas in which part or all of hydrogen atoms are substituted with halogen atoms such as fluorine atoms, chlorine atoms or the like. In particular, those examples include fluorinated carbon-based gas such as tetrafluoromethane ($CF_4$) gas or trifluoromethane ($CHF_3$) gas; carbon chloride-based gas such as tetrachloromethane ($CCl_4$) gas; and the like.

[Step (vi)]

Step (vi) is a step of etching the hard mask layer (m1) with the inorganic pattern (m2p) as a mask to form the resin pattern (m1p).

A method of etching is not particularly limited, and common dry etching can be employed the same as in step (vi). Examples of the etching gas used for etching the hard mask layer (m1) include oxygen gas, sulfur dioxide gas, halogen-based gas, and the like. For example, oxygen plasma etching using oxygen gas as the etching gas is preferred.

[Step (vii)]

Step (vii) is a step of processing the support 10 with the resin pattern (m1p) as a mask.

The support 10 can be processed by, for example, etching the processing layer 12 with the resin pattern (m1p) as a mask. A method of etching is not particularly limited, and common dry etching can be employed the same as in step (vi). Examples of the etching gas used for etching the processing layer 12 include halogen-based gas.

In the method for manufacturing an electronic component according to the embodiment, the hard mask layer (m1) can be thickened (1 µm or more) since the hard mask layer (m1) is formed using the hard mask-forming composition according to the first aspect. Accordingly, the resin pattern formed from the hard mask layer (m1) can be suitably used as a mask for deep processing.

The method of manufacturing an electronic component by the three-layer resist method has been described above, the electronic component may be manufactured by the two-layer resist method. In that case, the resist film 30, instead of the hard mask layer (m2), is formed on the hard mask layer (m1).

The resist film 30 is exposed and developed to form the resist pattern 30p on the hard mask layer (m1) in the same manner as in step (iv).

The hard mask layer (m1) is etched with the resist pattern 30p as a mask to form the resin pattern (m1p) in the same manner as in step (vi).

The support 10 is processed with the resin pattern (m1p) as a mask to form the pattern 12p in the same manner as in step (vii).

Thus, the electronic component can also be manufactured by the two-layer resist method.

Therefore, the present invention also provides the method for manufacturing an electronic component, including steps of:

forming the hard mask layer (m1) on the support using the hard mask-forming composition according to the first aspect;

forming the resist film on the hard mask layer (m1);

forming the resist pattern on the hard mask layer (m1) by exposing and developing the resist film;

etching the hard mask layer (m1) with the resist pattern as a mask to form the resin pattern; and processing the support with the resin pattern as a mask.

Second Embodiment

The method for manufacturing an electronic component according to the third aspect includes steps of:

forming a hard mask layer (m1) on a support using the hard mask-forming composition according to the first aspect (hereinafter referred to as "step (i)'");

forming an inorganic pattern made of an inorganic material on the hard mask layer (m1) (hereinafter referred to as "step (v)'");

etching the hard mask layer (m1) using the inorganic pattern as a mask to form a resin pattern (hereinafter referred to as "step (vi)'"); and processing the support with the resin pattern as a mask (hereinafter referred to as "step (vii)'").

The method for manufacturing an electronic component according to the third aspect is the same as the method for manufacturing an electronic component according to the second aspect, except that the inorganic pattern made of the inorganic material is formed directly on the hard mask layer (m1) without forming the resist film.

Hereinafter, a specific example of the method for manufacturing an electronic component according to an embodiment will be described with reference to FIGS. 1, 2 and 6 to 8. However, the manufacturing method according to the embodiment is not limited thereto.

First, the hard mask layer (m1) is formed on the support 10 using the hard mask-forming composition according to the first aspect (FIGS. 1 and 2; step (i)'). This step is the same as step (i) in the method for manufacturing an electronic component according to the second aspect.

The inorganic pattern (m2p) made of the inorganic material is formed on the hard mask layer (m1) (FIG. 6; step (v)'). As the inorganic material for forming the inorganic pattern (m2p), for example, the same inorganic material as exemplified in step (ii) in the method for manufacturing an electronic component according to the second aspect, and a resist composition containing the inorganic material can be employed. A method for forming the inorganic pattern (m2p) is not particularly limited, and commonly known methods can be used. For example, the inorganic pattern (m2p) is formed on the hard mask layer (m1) by forming an inorganic resist film on the hard mask layer (m1) using a resist composition containing an inorganic material, and exposing and developing such a film.

The hard mask layer (m1) is etched with the inorganic pattern (m2p) as a mask to form the resin pattern (m1p) (FIG. 7; step (vi)'). This step is the same as step (vi) in the method for manufacturing an electronic component according to the second aspect.

The support 10 is processed with the resin pattern (m1p) as a mask to form the pattern 12p (FIG. 8; step (vii)'). This step is the same as step (vii) in the method for manufacturing an electronic component according to the second aspect.

The electronic component 100 provided with the pattern 12p on the substrate 11 can also be fabricated in this manner.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXAMPLES

Hereinafter, the present invention will be described in more detail referring to examples. However, the present invention is not limited to these examples.

<Exemplified Preparation of Resin (P)>
<Resin (P-1-1)>

In a three-necked flask connected to a thermometer, a reflux tube and a nitrogen inlet tube, 10.00 g (34.09 mmol) of 9-naphthylcarbazole, 36.17 g (40.9 mmol) of benzaldehyde, and 66.96 g (306.8 mmol) of 1-pyrenol were dissolved in 75.42 g of propylene glycol monomethyl ether acetate. 87.53 g of 10% PM solution of para-toluenesulfonic acid was added to the resultant mixture, and the mixture was heated and stirred at the reaction temperature 120° C. for 10 hours. The reaction solution was cooled to room temperature.

The resultant reaction solution was dropped into a large amount of methanol (MeOH) to precipitate a polymer. The precipitated brown powder was washed with a large amount of methanol and dried to obtain 85 g (75% yield) of a resin (P-1-1).

For the resin (P-1-1), a weight average molecular weight (Mw) of standard polystyrene conversion calculated by GPC measurement is 4,400, and a molecular weight dispersion degree (Mw/Mn) is 2.10.

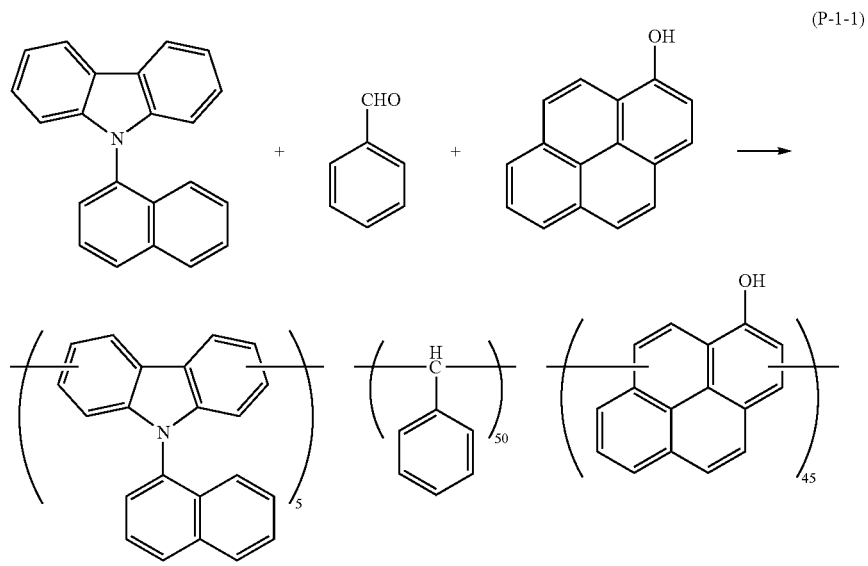

<Resin (P-2-1)>

Addition condensation of m-cresol, p-cresol and formaldehyde was carried out in the presence of an acid catalyst according to a conventional method to obtain the following resin (P-2-1). For the resin (P-2-1), a weight average molecular weight (Mw) of standard polystyrene conversion calculated by GPC measurement is 21,000, and a molecular weight dispersion degree (Mw/Mn) is 26.

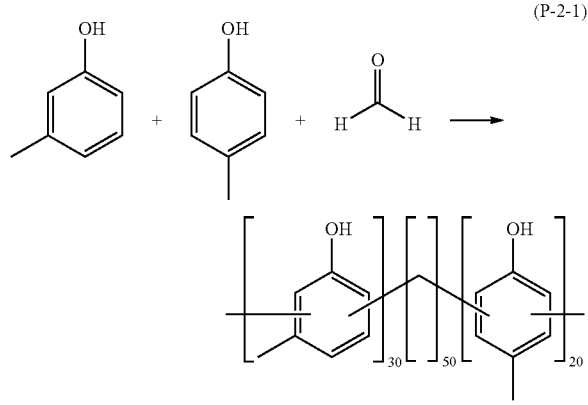

<Resin (P-3-1-1), Resin (P-3-1-2) and Resin (P-3-2)>

A resin (P-3-1-1), a resin (P-3-1-2) and a resin (P-3-2) were each synthesized by radically polymerizing monomers from which respective structural units are derived according to a conventional method. For these resins, a weight average molecular weight (Mw) of standard polystyrene conversion calculated by GPC measurement and a molecular weight dispersion degree (Mw/Mn) are collectively shown below.

Examples 1 to 16, and Comparative Examples 1 to 8

<Preparation of Hard Mask-Forming Composition>

Components listed in Tables 1 to 3 were mixed and dissolved to prepare hard mask-forming compositions of examples (solid content concentration: 18 to 20 mass %), respectively.

TABLE 1

| | Resin Component | Additive 1 | Additive 2 | Solvent |
|---|---|---|---|---|
| Example 1 | (P)-1 [100] | (O)-1 [30] | (A)-1 [0.1] | (S)-1 [450] |
| Example 2 | (P)-1 [100] | (O)-1 [50] | (A)-1 [0.1] | (S)-1 [450] |
| Example 3 | (P)-1 [100] | (O)-2 [30] | (A)-1 [0.1] | (S)-1 [450] |
| Example 4 | (P)-1 [100] | (O)-3 [30] | (A)-1 [0.1] | (S)-1 [450] |
| Example 5 | (P)-1 [100] | (O)-4 [30] | (A)-1 [0.1] | (S)-1 [450] |
| Example 6 | (P)-1 [100] | (F)-1 [30] | (A)-1 [0.1] | (S)-1 [450] |
| Example 7 | (P)-1 [100] | (F)-2 [30] | (A)-1 [0.1] | (S)-1 [450] |

TABLE 2

| | Resin Component | Additive 1 | Additive 2 | Solvent |
|---|---|---|---|---|
| Example 8 | (P)-2 [100] | (O)-1 [30] | (A)-1 [0.1] | (S)-2 [450] |
| Example 9 | (P)-2 [100] | (O)-2 [30] | (A)-1 [0.1] | (S)-2 [450] |
| Example 10 | (P)-2 [100] | (O)-3 [30] | (A)-1 [0.1] | (S)-2 [450] |
| Example 11 | (P)-2 [100] | (O)-4 [30] | (A)-1 [0.1] | (S)-2 [450] |
| Example 12 | (P)-2 [100] | (F)-1 [30] | (A)-1 [0.1] | (S)-2 [450] |
| Example 13 | (P)-2 [100] | (F)-2 [30] | (A)-1 [0.1] | (S)-2 [450] |
| Example 14 | (P)-3 [100] | (O)-1 [30] | (A)-1 [0.1] | (S)-2 [450] |
| Example 15 | (P)-4 [100] | (O)-1 [30] | (A)-1 [0.1] | (S)-2 [450] |
| Example 16 | (P)-5 [100] | (F)-1 [30] | (A)-1 [0.1] | (S)-2 [450] |

TABLE 3

| | Resin Component | Additive 1 | Additive 2 | Solvent |
|---|---|---|---|---|
| Com. Ex. 1 | (P)-1 [100] | — | (A)-1 [0.1] | (S)-1 [450] |
| Com. Ex. 2 | (P)-1 [100] | (C)-1 [30] | (A)-1 [0.1] | (S)-1 [450] |
| Com. Ex. 3 | (P)-1 [100] | (P)-2 [30] | (A)-1 [0.1] | (S)-1 [450] |
| Com. Ex. 4 | (P)-2 [100] | — | (A)-1 [0.1] | (S)-2 [450] |
| Com. Ex. 5 | (P)-2 [100] | (C)-1 [30] | (A)-1 [0.1] | (S)-2 [450] |
| Com. Ex. 6 | (P)-3 [100] | — | (A)-1 [0.1] | (S)-3 [450] |
| Com. Ex. 7 | (P)-4 [100] | — | (A)-1 [0.1] | (S)-3 [450] |
| Com. Ex. 8 | (P)-5 [100] | — | (A)-1 [0.1] | (S)-3 [450] |

Each abbreviation in Tables 1 to 3 is defined as follows. The numerical values in square brackets are a blending amount (parts by mass).

(P)-1: Resin (P-1-1)
(P)-2: Resin (P-2-1)
(P)-3: Resin (P-3-1-1)
(P)-4: Resin (P-3-1-2)
(P)-5: Resin (P-3-2)
(O)-1: Compound (O1-1)
(O)-2: Compound (O1-2)
(O)-3: Compound (O1-3)
(O)-4: Compound (O1-4)
(F)-1: Compound (F1-1)
(F)-2: Compound (F1-2)
(C)-1: Compound (C-1)
(A)-1: Fluorinated surfactant, manufactured by DIC Corporation (product name: "R-40")
(S)-1: Mixed solvent of propylene glycol monomethyl ether acetate (PGMEA)/γ-butyrolactone=75/25 (mass ratio)
(S)-2: Mixed solvent of propylene glycol monomethyl ether acetate (PGMEA)/cyclohexane=75/25 (mass ratio)
(S)-3: Propylene glycol monomethyl ether acetate (PGMEA)

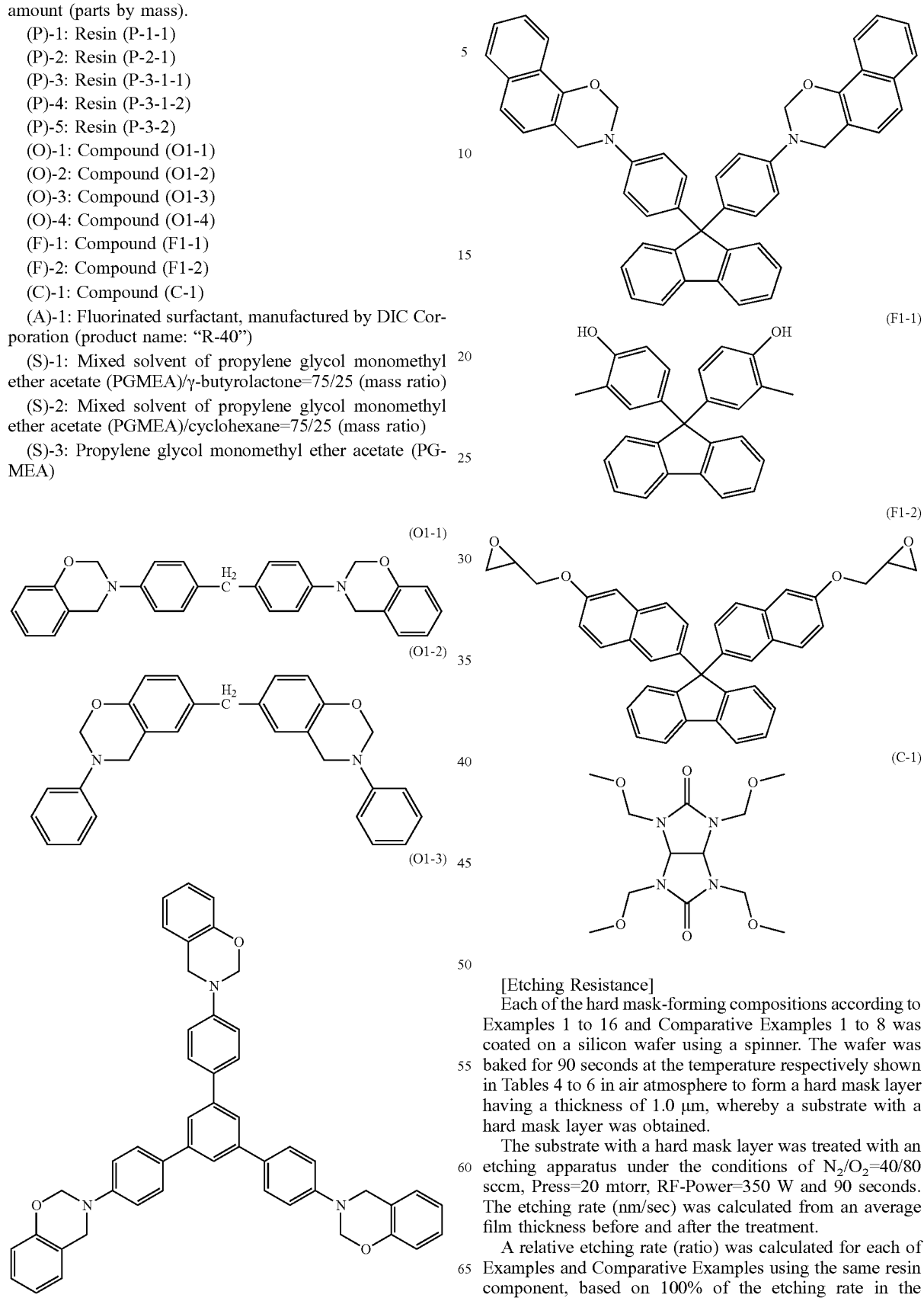

[Etching Resistance]

Each of the hard mask-forming compositions according to Examples 1 to 16 and Comparative Examples 1 to 8 was coated on a silicon wafer using a spinner. The wafer was baked for 90 seconds at the temperature respectively shown in Tables 4 to 6 in air atmosphere to form a hard mask layer having a thickness of 1.0 μm, whereby a substrate with a hard mask layer was obtained.

The substrate with a hard mask layer was treated with an etching apparatus under the conditions of $N_2/O_2$=40/80 sccm, Press=20 mtorr, RF-Power=350 W and 90 seconds. The etching rate (nm/sec) was calculated from an average film thickness before and after the treatment.

A relative etching rate (ratio) was calculated for each of Examples and Comparative Examples using the same resin component, based on 100% of the etching rate in the comparative examples (Comparative Examples 1, 4, 6, 7 and 8) in which Additive 1 was not added. The acquired rate was evaluated according to the following evaluation criteria. The results are summarized in Tables 4 to 6.

Evaluation Criteria

Examples 1 to 7, and Comparative Examples 2 and 3

AA: A ratio to the etching rate of Comparative Example 1 is 100% or less.
A: A ratio to the etching rate of Comparative Example 1 is more than 100% and 105% or less.
B: A ratio to the etching rate of Comparative Example 1 is more than 105% and 110% or less.
C: A ratio to the etching rate of Comparative Example 1 is more than 110%.

Examples 8 to 13, and Comparative Example 5

AA: A ratio to the etching rate of Comparative Example 4 is 100% or less.
A: A ratio to the etching rate of Comparative Example 4 is more than 100% and 105% or less.
B: A ratio to the etching rate of Comparative Example 4 is more than 105% and 110% or less.
C: A ratio to the etching rate of Comparative Example 4 is more than 110%.

Example 14

AA: A ratio to the etching rate of Comparative Example 6 is 100% or less.
A: A ratio to the etching rate of Comparative Example 6 is more than 100% and 105% or less.
B: A ratio to the etching rate of Comparative Example 6 is more than 105% and 110% or less.
C: A ratio to the etching rate of Comparative Example 6 is more than 110%.

Example 15

AA: A ratio to the etching rate of Comparative Example 7 is 100% or less.
A: A ratio to the etching rate of Comparative Example 7 is more than 100% and 105% or less.
B: A ratio to the etching rate of Comparative Example 7 is more than 105% and 110% or less.
C: A ratio to the etching rate of Comparative Example 7 is more than 110%.

Example 16

AA: A ratio to the etching rate of Comparative Example 8 is 100% or less.
A: A ratio to the etching rate of Comparative Example 8 is more than 100% and 105% or less.
B: A ratio to the etching rate of Comparative Example 8 is more than 105% and 110% or less.
C: A ratio to the etching rate of Comparative Example 8 is more than 110%.

[Embeddability]

Each of the hard mask-forming compositions according to Examples 1 to 16 and Comparative Examples 1 to 8 was applied by spin coating on a silicon wafer stepped substrate (substrate to be processed) having a pitch of 200 nm, a line-and-space of 100 nm, and a depth of 200 nm. The wafer was baked for 90 seconds at the temperature respectively shown in Tables 1 to 3 in air atmosphere to form a hard mask layer having a thickness of 300 nm, whereby a stepped substrate with a hard mask layer was obtained.

A cross-sectional shape of the stepped substrate with a hard mask layer was observed with a scanning electron microscope (product name: SU8000, manufactured by Hitachi High-Technologies Corporation), and embeddability was evaluated based on the following evaluation criteria. The results are summarized in Tables 4 to 6.

Evaluation Criteria
A: good (no void observed)
B: defective (void was observed)

TABLE 4

|  | Baking Temperature (° C.) | Etching Resistance | Embeddability |
| --- | --- | --- | --- |
| Example 1 | 400 | A | A |
| Example 2 | 400 | A | A |
| Example 3 | 400 | A | A |
| Example 4 | 400 | A | A |
| Example 5 | 400 | A | A |
| Example 6 | 400 | A | A |
| Example 7 | 400 | A | A |

TABLE 5

|  | Baking Temperature (° C.) | Etching Resistance | Embeddability |
| --- | --- | --- | --- |
| Example 8 | 240 | AA | A |
| Example 9 | 240 | AA | A |
| Example 10 | 240 | AA | A |
| Example 11 | 240 | AA | A |
| Example 12 | 240 | AA | A |
| Example 13 | 240 | AA | A |
| Example 14 | 240 | AA | A |
| Example 15 | 240 | AA | A |
| Example 16 | 130 | AA | A |

TABLE 6

|  | Baking Temperature (° C.) | Etching Resistance | Embeddability |
| --- | --- | --- | --- |
| Com. Ex. 1 | 400 | — | B |
| Com. Ex. 2 | 400 | B | A |
| Com. Ex. 3 | 400 | C | B |
| Com. Ex. 4 | 240 | — | B |
| Com. Ex. 5 | 240 | B | A |
| Com. Ex. 6 | 240 | — | A |
| Com. Ex. 7 | 240 | — | A |
| Com. Ex. 8 | 130 | — | A |

It is confirmed that both excellent etching resistance and good embeddability can be achieved in the hard mask-forming compositions of Examples 1 to 16 from the results summarized in Tables 4 to 6.

Examples 17 to 18, and Comparative Example 9

<Preparation of Hard Mask-Forming Composition>
Components listed in Table 7 were mixed and dissolved to prepare hard mask-forming compositions of examples (solid content concentration: 18 to 20 mass % for Examples 17 and 18; 25 mass % for Comparative Example 9), respectively.

TABLE 7

|  | Resin Component | Additive 1 | Additive 2 | Solvent |
|---|---|---|---|---|
| Example 17 | (P)-1 [100] | (O)-3 [30] | (A)-1 [0.1] | (S)-1 [450] |
| Example 18 | (P)-2 [100] | (O)-3 [30] | (A)-1 [0.1] | (S)-2 [450] |
| Com. Ex. 9 | — | (O)-3 [100] | (A)-1 [0.1] | (S)-3 [300] |

Each abbreviation in Table 7 is defined as follows. The numerical values in square brackets are a blending amount (parts by mass).

(P)-1: Resin (P-1-1)

(P)-2: Resin (P-2-1)

(O)-3: Compound (O1-3)

(A)-1: Fluorinated surfactant, manufactured by DIC Corporation (product name: "R-40")

(S)-1: Mixed solvent of propylene glycol monomethyl ether acetate (PGMEA)/γ-butyrolactone=75/25 (mass ratio)

(S)-2 Mixed solvent of propylene glycol monomethyl ether acetate (PGMEA)/cyclohexane=75/25 (mass ratio)

(S)-3: Propylene glycol monomethyl ether acetate (PGMEA)

[Etching Resistance]

Each of the hard mask-forming compositions according to Examples 17 to 18 and Comparative Example 9 was coated on a silicon wafer using a spinner, whereby a substrate with a hard mask layer was obtained in the same manner stated above.

The substrate with a hard mask layer was treated with an etching apparatus under the conditions of $N_2/O_2$=40/80 sccm, Press=20 mtorr, RF-Power=350 W and 90 seconds. The etching rate (nm/sec) was calculated from an average film thickness before and after the treatment.

A relative etching rate (ratio) was calculated based on 100% of the etching rate in Comparative Example 9. The acquired rate was evaluated according to the following evaluation criteria. The results are summarized in Table 8.

Evaluation Criteria

AA: A ratio to the etching rate of Comparative Example 9 is 100% or less.

A: A ratio to the etching rate of Comparative Example 9 is more than 100% and 105% or less.

B: A ratio to the etching rate of Comparative Example 9 is more than 105% and 110% or less.

C: A ratio to the etching rate of Comparative Example 9 is more than 110%.

<Embeddability>

A stepped substrate with a hard mask layer was prepared in the same manner stated above, and a cross-sectional shape of the stepped substrate with a hard mask layer was observed with a scanning electron microscope (product name: SU8000, manufactured by Hitachi High-Technologies Corporation). Embeddability was evaluated based on the following evaluation criteria. The results are summarized in Table 8.

Evaluation Criteria

A: good (no void observed)

B: defective (void was observed)

TABLE 8

|  | Baking Temperature (° C.) | Etching Resistance | Embeddability |
|---|---|---|---|
| Example 17 | 400 | AA | A |
| Example 18 | 240 | AA | A |
| Com. Ex. 9 | 130 | — | A |

It is confirmed that etching resistance in the hard mask-forming compositions of Examples 17 to 18 is improved as compared with that of Comparative Example 9, from the results summarized in Table 8.

(Solubility Test of Resin)

The resin (P-1-1), the resin (P-2-1), the resin (P-3-1-1), the resin (P-3-1-2), and the resin (P-3-2) and the following resin (P2-1) were dissolved in propylene glycol monomethyl ether acetate (PGMEA) until the content would be 30 mass %.

Consequently, the resin (P-1-1), the resin (P-2-1), the resin (P-3-1-1), the resin (P-3-1-2) and the resin (P-3-2) exhibited good solubility in PGMEA, with which 30 mass % PGMEA solution could be prepared. Meanwhile, the resin (P2-1) had the poor solubility in PGMEA, with which 30 mass % PGMEA solution could not be prepared.

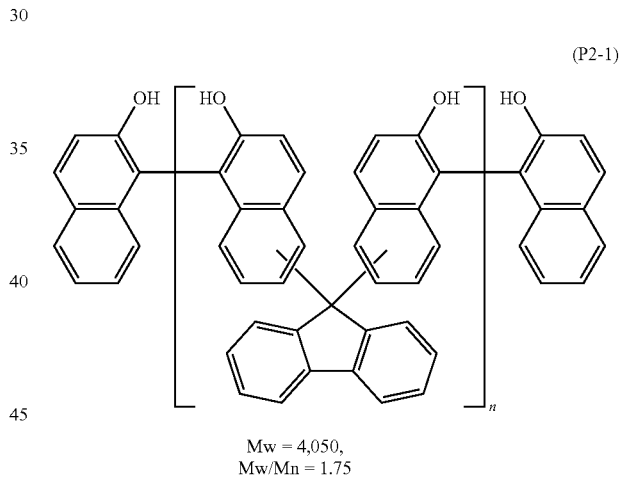

(P2-1)

Mw = 4,050, Mw/Mn = 1.75

EXPLANATION OF REFERENCES

10: support

11: substrate

12: processing layer

12p: pattern

20: BARC layer

30: resist film

30p: resist pattern m1, m2: hard mask layer m1p: resin pattern m2p: inorganic pattern

100: electronic component

What is claimed is:

1. A hard mask-forming composition, which forms a hard mask used in lithography, comprising:
   a resin (P) containing an aromatic ring and a polar group; and
   a compound (OF)
   represented by the following general formula (f1-1-1):

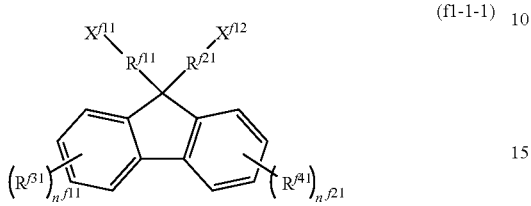

(f1-1-1)

wherein $R^{f11}$ and $R^{f21}$ each independently represents a phenyl group or a naphthyl group which may have a substituent selected from the group consisting of a hydroxy group, a carboxy group, a halogen atom, an amino group, a nitro group, a sulfo group, an alkoxy group, an epoxy group, an alkyl group, a halogenated alkyl group, a glycidyl group, and a glycidoxy group; $R^{f31}$ and $R^{f41}$ each independently represents a hydrocarbon group having 1 to 20 carbon atoms which may have a substituent, a halogen atom, a nitro group, an amino group, or a sulfo group; $X^{f11}$ and $X^{f21}$ each independently represents a polar group; and $n^{f11}$ and $n^{f21}$ each independently represents an integer of 0 to 4.

2. The hard mask-forming composition according to claim 1, wherein the polar group contained in the resin (P) is selected from the group consisting of a hydroxy group, a carboxy group, an amino group, a sulfo group, an alkoxy group, and an epoxy group.

3. The hard mask-forming composition according to claim 1, wherein the resin (P) contains a resin (P-1) having a structural unit (u11) represented by the following general formula (u11-1) and a structural unit (u12) represented by the following general formula (u12-1):

(u11-1)

(u12-1)

wherein $R^{11}$ is a polycyclic aromatic hydrocarbon group having 10 to 30 carbon atoms which may have a substituent; and $R^{12}$ is an aromatic hydrocarbon group having 6 to 30 carbon atoms which may have a substituent, or a hydrogen atom.

4. The hard mask-forming composition according to claim 1, wherein the resin (P) contains a phenol resin (P-2) having a structural unit (u21) represented by the following general formula (u21-1) and a structural unit (u22) represented by the following general formula (u22-1):

(u21-1)

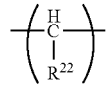

(u22-1)

wherein $R^{21}$ is an organic group derived from a phenol compound having at least one hydroxy group; and $R^{22}$ is an aromatic hydrocarbon group having 6 to 30 carbon atoms which may have a substituent, or a hydrogen atom.

5. The hard mask-forming composition according to claim 1, wherein the resin (P) contains a resin (P-3) having a structural unit (u31) represented by the following general formula (u31-1):

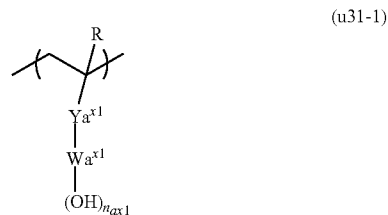

(u31-1)

wherein R is a hydrogen atom, an alkyl group having 1 to 5 carbon atoms, or a halogenated alkyl group having 1 to 5 carbon atoms; $Y_a^{x1}$ is a single bond or a divalent linking group; $W_a^{x1}$ is a $(n_{ax1}+1)$-valent aromatic hydrocarbon group; and $n_{ax1}$ is an integer of 1 to 3.

6. The hard mask-forming composition according to claim 5, wherein the resin (P-3) further has a structural unit (u32) represented by the following general formula (u32-1):

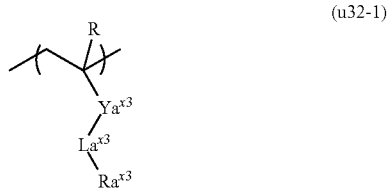

(u32-1)

wherein R is a hydrogen atom, an alkyl group having 1 to 5 carbon atoms, or a halogenated alkyl group having 1 to 5 carbon atoms; $Y^{ax3}$ is a single bond or a divalent linking group; $L^{ax3}$ is —O—, —COO—, —CON(R')—, —OCO—, —CONHCO— or —CONHCS— and R' represents a hydrogen atom or a methyl group, provided that $Y^{ax3}$ is not —CO— in the case where $L^{ax3}$ is —O—; and $Ra^{x3}$ is a hydrogen atom, or a hydrocarbon group which may have a substituent.

7. A method for manufacturing an electronic component, comprising:
   forming a hard mask layer (m1) on a support using the hard mask-forming composition according to claim 1;
   forming a hard mask layer (m2) made of an inorganic material on the hard mask layer (m1);
   forming a resist film on the hard mask layer (m2);
   forming a resist pattern on the hard mask layer (m2) by exposing and developing the resist film;
   etching the hard mask layer (m2) using the resist pattern as a mask to form an inorganic pattern;

etching the hard mask layer (m1) using the inorganic pattern as a mask to form a resin pattern; and processing the support with the resin pattern as a mask.

8. A method for manufacturing an electronic component, comprising:

forming a hard mask layer (m1) on a support using the hard mask-forming composition according to claim 1;

forming an inorganic pattern made of an inorganic material on the hard mask layer (m1);

etching the hard mask layer (m1) using the inorganic pattern as a mask to form a resin pattern; and processing the support with the resin pattern as a mask.

\* \* \* \* \*